(12) United States Patent
Li

(10) Patent No.: US 12,120,850 B2
(45) Date of Patent: Oct. 15, 2024

(54) MODE CONTROL METHOD AND SYSTEM, AND ELECTRONIC DEVICE, AND STORAGE MEDIUM

(71) Applicant: ZHEJIANG SANHUA INTELLIGENT CONTROLS CO., LTD, Zhejiang (CN)

(72) Inventor: Shuang Li, Zhejiang (CN)

(73) Assignee: Zhejiang Sanhua Intelligent Controls Co., LTD, Zhejiang (CN)

( * ) Notice: Subject to any disclaimer, the term of this patent is extended or adjusted under 35 U.S.C. 154(b) by 832 days.

(21) Appl. No.: 17/059,093

(22) PCT Filed: May 17, 2019

(86) PCT No.: PCT/CN2019/087419
§ 371 (c)(1),
(2) Date: Nov. 25, 2020

(87) PCT Pub. No.: WO2019/228197
PCT Pub. Date: Dec. 5, 2019

(65) Prior Publication Data
US 2021/0227720 A1 Jul. 22, 2021

(30) Foreign Application Priority Data

May 28, 2018 (CN) .......................... 201810519512.7
May 28, 2018 (CN) .......................... 201810523977.X

(51) Int. Cl.
*H05K 7/20* (2006.01)
*G05B 19/045* (2006.01)

(52) U.S. Cl.
CPC ..... *H05K 7/20381* (2013.01); *H05K 7/20327* (2013.01); *G05B 19/045* (2013.01); *G05B 2219/25257* (2013.01)

(58) Field of Classification Search
None
See application file for complete search history.

(56) References Cited

U.S. PATENT DOCUMENTS

2005/0264253 A1 12/2005 Ivankovic
2009/0039807 A1* 2/2009 Yabusaki ................ H02P 25/18
                                                                  318/244

(Continued)

FOREIGN PATENT DOCUMENTS

CN    101090853 A    12/2007
CN    101108656 A     1/2008

(Continued)

OTHER PUBLICATIONS

Xinyu Liu, First Office Action; Chinese Patent Application No. 201810519512.7; Aug. 1, 2022; 7 pages, The State Intellectual Property Office of the People's Republic of China.

(Continued)

*Primary Examiner* — David Earl Ogg
(74) *Attorney, Agent, or Firm* — Crain Caton & James; William P. Jensen

(57) ABSTRACT

Provided is a mode control method that includes obtaining a PWM signal; obtaining a duty cycle of the PWM signal; obtaining a target rotational speed of an electric pump based on the duty cycle of the PWM signal; in response to determining that the target rotational speed of the electric pump is equal to 0 and the target rotational speed of the electric pump remains equal to 0 for the set duration, entering the sleep mode by the microcontroller; and in response to determining that the target rotational speed of the electric pump is not equal to 0 or the target rotational speed of the electric pump does not remain equal to 0 for the set duration, entering the working mode by the microcon- (Continued)

troller. Further provided are a mode control system, an electronic device and a storage medium.

17 Claims, 11 Drawing Sheets

(56) References Cited

U.S. PATENT DOCUMENTS

| | | | | |
|---|---|---|---|---|
| 2009/0039820 | A1* | 2/2009 | Milano | H02P 29/0241 |
| | | | | 318/590 |
| 2012/0043953 | A1* | 2/2012 | Ohmaru | H02M 3/156 |
| | | | | 323/283 |
| 2014/0077744 | A1 | 3/2014 | Lee et al. | |
| 2014/0084832 | A1* | 3/2014 | Sato | H01M 10/613 |
| | | | | 318/452 |

FOREIGN PATENT DOCUMENTS

| | | | |
|---|---|---|---|
| CN | 101123561 A | | 2/2008 |
| CN | 102820842 A | * | 12/2012 |
| CN | 102820842 A | | 12/2012 |
| CN | 103534926 A | | 1/2014 |
| CN | 104329008 A | | 2/2015 |
| CN | 105150957 A | | 12/2015 |
| CN | 106766664 A | | 5/2017 |
| JP | 2004023862 A | | 1/2004 |
| JP | 2004248438 A | | 9/2007 |
| WO | 2009020737 A2 | | 2/2009 |
| WO | 2018090655 A1 | | 5/2018 |

OTHER PUBLICATIONS

Anton Roider, Extended European Search Report, EP Application No. 19810201.4, Feb. 22, 2022, 7 pages, European Patent Office, Munich, Germany.

Han, Beibei, International Search Report for PCT App. No. PCT/CN2019/087419, Aug. 7, 2019, 4 pages, China National Intellectual Property Administration, China.

Ge Jiawu, Notice of First Examination Opinion for CN201810523977.X, Jan. 21, 2024, 13 pages, Chinese Intellectual Property Office, Beijing China.

* cited by examiner

MODE CONTROL METHOD AND SYSTEM, AND ELECTRONIC DEVICE, AND STORAGE MEDIUM

CROSS-REFERENCE TO RELATED APPLICATIONS

This application is a U.S. National Stage Application of PCT Application Serial Number PCT/CN2019/087419, filed May 17, 2019, which claims priority to Chinese Patent Application No. 201810519512.7, filed May 28, 2018, and Chinese Patent Application No. 201810523977.X, filed May 28, 2018, the disclosures of which are incorporated herein by reference in their entireties.

TECHNICAL FIELD

Embodiments of the present disclosure relate to the control field, for example, a mode control method and system, an electronic device, and a storage medium.

BACKGROUND

An electric pump is applicable to the refrigeration cycle of a vehicle. The operation of the electric pump is implemented by the control system of the electric pump. The electric pump includes a motor and a rotor. The motor drives the rotor to rotate. The control system controls the motor to rotate. The control system includes a host computer, a microcontroller (also microcontroller unit, MCU) and a communication system. The host computer sends a control command to the microcontroller through the communication system. The microcontroller parses the control command and controls the motor to rotate and in turn drive the electric pump to rotate. Meanwhile, the microcontroller returns the running status of the electric pump to the host computer through the communication system. The host computer is the controller of the vehicle. The microcontroller is integrated on an electric control board of the electric pump. Control information and feedback information are transferred between the host computer and the microcontroller through the communication system.

The microcontroller may be used for controlling the rotation parameters of the electric pump. When the microcontroller is in the working mode, the microcontroller sends a control signal to the electric pump, and the electric pump rotates at the target rotational speed under the action of the control signal sent by the microcontroller. However, when the electric pump stops rotating, the microcontroller cannot stop running simultaneously, that is, the microcontroller is still in the working mode, thereby greatly increasing the quiescent current of the microcontroller and thus increasing the power consumption of the microcontroller.

SUMMARY

Embodiments of the present disclosure provide a mode control method and system, an electronic device and a storage medium capable of reducing the quiescent current of a microcontroller and thus reducing the power consumption of the microcontroller.

An embodiment of the present disclosure provides a mode control method applied to a microcontroller configured to control an electric pump. The mode control method includes the steps below.

A pulse-width modulation (PWM) signal is obtained.
A duty cycle of the PWM signal is obtained.

A target rotational speed of the electric pump is obtained based on the duty cycle of the PWM signal.

A determination is made regarding whether the target rotational speed of the electric pump is equal to 0 and whether the target rotational speed of the electric pump remains equal to 0 for the set duration. In response to determining that the target rotational speed of the electric pump is equal to 0 and the target rotational speed of the electric pump remains equal to 0 for the set duration, the microcontroller enters the sleep mode. In response to determining that the target rotational speed of the electric pump is not equal to 0 or the target rotational speed of the electric pump does not remain equal to 0 for the set duration, the microcontroller enters the working mode.

An embodiment of the present disclosure provides a mode control system configured for controlling an electric pump. The mode control system includes a host computer and a microcontroller.

The host computer includes a pulse-width modulation (PWM) controller configured to issue a PWM signal.

The microcontroller is electrically connected to the host computer and configured to receive and parse the PWM signal to obtain the duty cycle of the PWM signal and obtain the target rotational speed of the electric pump based on the duty cycle of the PWM signal.

The microcontroller is further configured to: determine whether the target rotational speed of the electric pump is equal to 0 and determine whether the target rotational speed of the electric pump remains equal to 0 for the set duration; to enter the sleep mode in response to determining that the target rotational speed of the electric pump is equal to 0 and the target rotational speed of the electric pump remains equal to 0 for the set duration; and to enter the working mode in response to determining that the target rotational speed of the electric pump is not equal to 0 or the target rotational speed of the electric pump does not remain equal to 0 for the set duration.

An embodiment of the present disclosure provides an electronic device.

The electronic device includes one or more processors; and a storage device configured to store one or more programs.

When executed by the one or more processors, the one or more programs cause the one or more processors to perform the preceding method.

An embodiment of the present disclosure provides a storage medium storing one or more computer programs. When the one or more computer programs are executed, the preceding method is caused to be performed.

DETAILED DESCRIPTION

Solutions of embodiments of the present disclosure are described below in conjunction with drawings and implementations in embodiments of the present disclosure. Apparently, the embodiments described below are part, rather than all, of embodiments of the present disclosure.

An electric pump is applicable to the refrigeration cycle of a vehicle. The operation of the electric pump is implemented by the control system of the electric pump. The electric pump includes a motor and a rotor. The motor drives the rotor to rotate. The control system controls the motor to rotate. The control system includes a host computer, a microcontroller and a communication system. The host computer sends a control command to the microcontroller through the communication system. The microcontroller parses the control command and controls the motor to rotate and drive the electric pump to rotate. Meanwhile, the microcontroller feeds back the running status of the electric pump to the host computer through the communication system. The host computer is the controller of the vehicle. The microcontroller is integrated on the electric control board of the electric pump. Control information and feedback information are transferred between the host computer and the microcontroller through the communication system. The communication system may be a bus.

The microcontroller can be used for controlling the rotation parameters of the electric pump. When the microcontroller is in the working mode, the microcontroller can send a control signal to the electric pump according to the requirements of the rotation parameters of the electric pump, and the motor can rotate according to the set rotation parameters under the action of the control signal sent by the microcontroller, that is, the electric pump can rotate according to the requirements of the rotation parameters of the electric pump.

Figure 1:
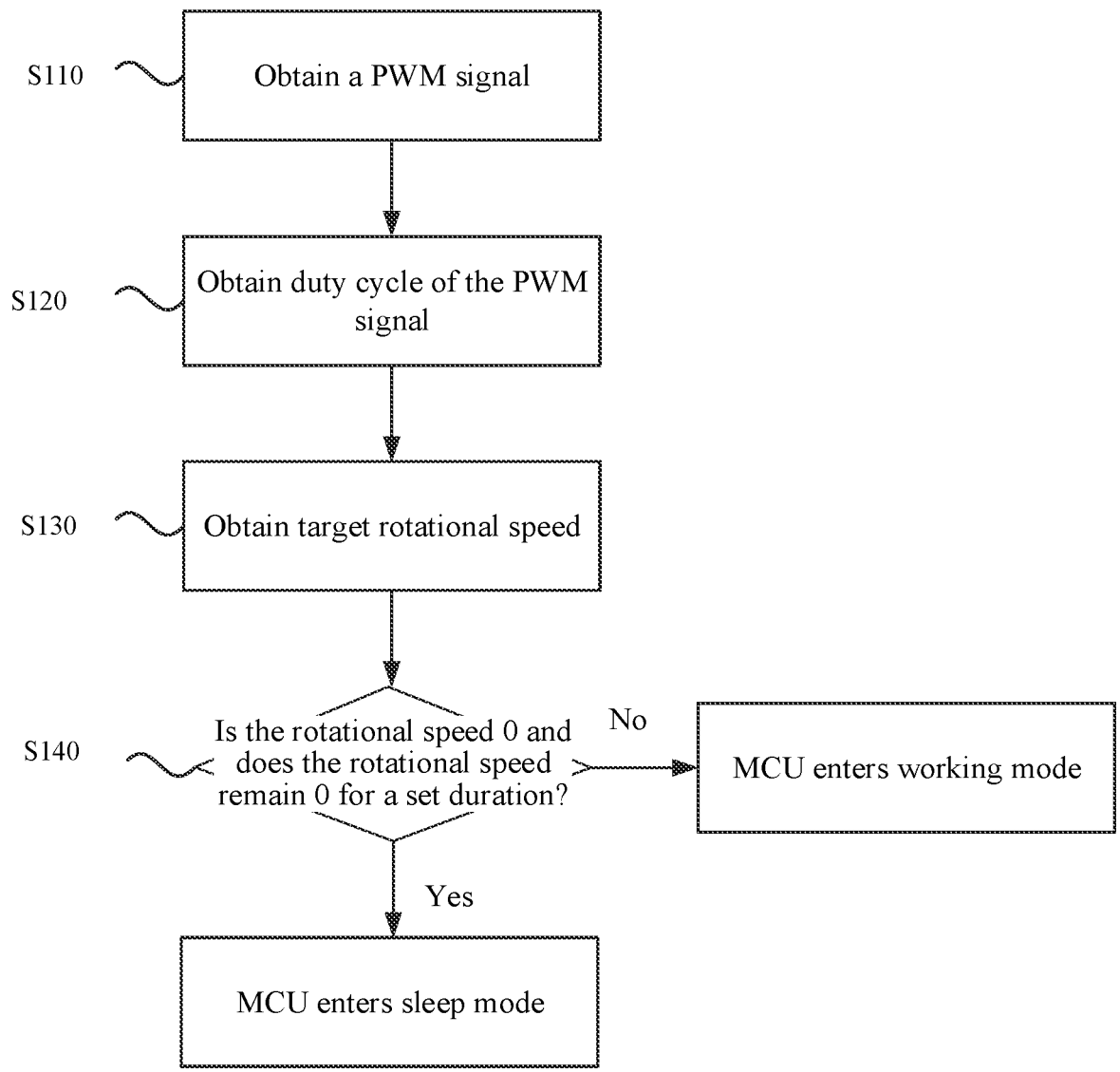
FIG. 1 is a flowchart of a mode control method according to an embodiment of the present disclosure.

FIG. 1 is a flowchart of a mode control method according to an embodiment of the present disclosure. The solution of this embodiment is applicable to the scenario of controlling an electric pump and is executable by a mode control system provided in embodiments of the present disclosure. For example, the solution is executable by a microcontroller in the mode control system. The mode control system can be implemented by software and/or hardware. The method includes the steps below.

In S110, a PWM signal is obtained.

In S120, a duty cycle of the PWM signal is obtained.

In an embodiment, the PWM signal is a pulse-width modulation signal, a square-wave signal containing a low level and a high level. The ratio of the high-level time in the PWM to the cycle of the PWM signal is the duty cycle of the PWM signal. Exemplarily, the PWM signal may be sent by a PWM signal controller, the PWM signal controller may be integrated in the host computer of the electric pump, the microcontroller can receive and process the PWM signal, the microcontroller can also generate a feedback signal, and the microcontroller can obtain the duty cycle of the PWM signal according to the ratio of the high-level time in the acquired PWM signal to the cycle of the PWM signal.

In S130, the target rotational speed of the electric pump is obtained based on the duty cycle of the PWM signal.

Figure 2:
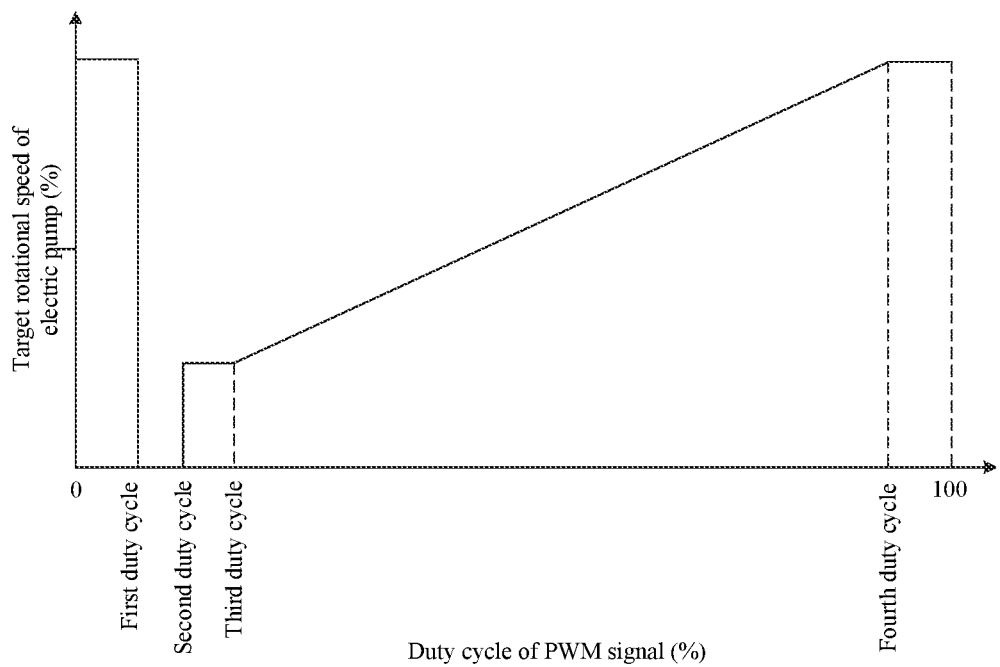
FIG. 2 is a schematic diagram illustrating the correspondence between the duty cycle of a PWM signal and the target rotational speed of an electric pump according to an embodiment of the present disclosure.
Figure 3:
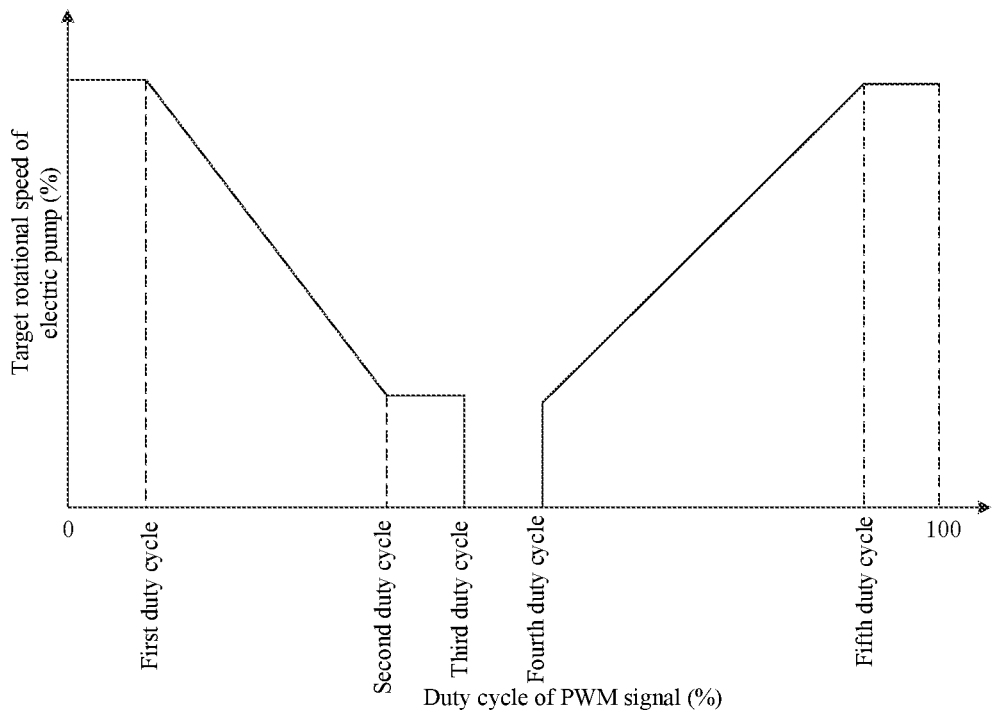
FIG. 3 is a schematic diagram illustrating another correspondence between the duty cycle of a PWM signal and the target rotational speed of an electric pump according to an embodiment of the present disclosure.

The rotation parameters of the motor correspond to the rotation parameters of the electric pump. A description is given in this embodiment of the present disclosure by using the rotation state of the electric pump as an example. Exemplarily, the target rotational speed of the electric pump may be obtained according to the duty cycle of the PWM signal in the manner of table lookup. FIG. 2 is a schematic diagram illustrating a correspondence between the duty cycle of a PWM signal and the target rotational speed of an electric pump according to an embodiment of the present disclosure. FIG. 3 is a schematic diagram illustrating another correspondence between the duty cycle of a PWM signal and the target rotational speed of an electric pump according to an embodiment of the present disclosure. As illustrated in FIG. 2, in this embodiment, the duty cycle of the PWM signal includes 5 segments. An interval greater than 0% and less than or equal to a first duty cycle is a first segment, an interval greater than the first duty cycle and less than or equal to a second duty cycle is a second segment, an interval greater than the second duty cycle and less than or equal to a third duty cycle is a third segment, an interval greater than the third duty cycle and less than or equal to a fourth duty cycle is a fourth segment, and an interval greater than the fourth duty cycle and less than or equal to 100% is a fifth segment.

The target rotational speed of the electric pump is 0 in the case where the duty cycle of the PWM signal is 0%. When the duty cycle of the PWM signal is in the first segment and the fifth segment, the target rotational speed of the electric pump reaches the maximum rotational speed. Since the duty cycle of the PWM signal is not easily distinguishable in the first segment and the fifth segment, the target rotational speed of the electric pump in the area where the duty cycle is not easily distinguishable reaches the maximum rotational speed, facilitating the normal operation of the electric pump. When the duty cycle of the PWM signal is in the second segment, the second segment is the preset duty cycle interval and the target rotational speed is 0. In this embodiment, the first duty cycle is set to 7%, and the second duty cycle is set to 12%. That is, when the duty cycle of the PWM signal is greater than 7% and less than or equal to 12%, the target rotational speed of the electric pump is 0. When the duty cycle of the PWM signal is in the third segment, the target rotational speed of the electric pump is the non-zero minimum rotational speed. In this embodiment, the third duty cycle is set to 18%. When the duty cycle of the PWM signal is in the fourth segment, the target rotational speed of the electric pump has a linear relationship with the duty cycle of the PWM signal. In this embodiment, the fourth duty cycle is set to 93%.

Thus, after the duty cycle of the PWM signal is obtained, the target rotational speed of the electric pump may be obtained according to the duty cycle of the PWM signal with reference to FIG. 2 in the manner of table lookup. In an embodiment, the second segment may also be configured between the third segment and the fourth segment or between the fourth segment and the fifth segment as required. In this embodiment, the rotational speed of the electric pump corresponding to the duty cycle of the PWM signal corresponding to the second segment is set to 0, and the electric pump can be controlled by the sent PWM signal corresponding to the second segment to stop rotating, helping satisfy the requirements of multiple operating conditions of the electric pump and control the electric pump according to the circumstances. The second segment is configured between the first segment and the third segment, the rotational speed of the electric pump corresponding to the third, fourth, and fifth segments increases from the non-zero minimum rotational speed to the maximum rotational speed, and the rotational speed is relatively continuous as the duty cycle of the PWM signal increases, helping reduce the difficulty in controlling segmentation. Meanwhile, the non-zero minimum rotational speed and the maximum rotational speed each correspond to a segment of duty cycle of the PWM signal so that the limit to the duty cycle of the PWM signal sent by the host computer is reduced.

In an embodiment, as illustrated in FIG. 3, in this embodiment, the duty cycle of the PWM signal includes 6 segments. An interval greater than 0% and less than or equal to a first duty cycle is a first segment, an interval greater than the first duty cycle and less than or equal to a second duty cycle is a second segment, an interval greater than the second duty cycle and less than or equal to a third duty cycle is a third segment, an interval greater than the third duty cycle and less than or equal to a fourth duty cycle is a fourth segment, an interval greater than the fourth duty cycle and less than or equal to a fifth duty cycle is a fifth segment, and an interval greater than the fifth duty cycle and less than or equal to 100% is a sixth segment. In this embodiment, the first duty cycle is 10%, the second duty cycle is 40%, the third duty cycle is 50%, the fourth duty cycle is 60%, and the fifth duty cycle is 90%. Compared with the schematic diagram illustrating the correspondence between the duty cycle of the PWM signal and the target rotational speed of the electric pump as shown in FIG. 2, the value of the first duty cycle increases slightly, and the value of the fifth duty cycle is slightly less than that of the fourth duty cycle. In this manner, the length of the first segment and the length of the sixth segment can be further enlarged so that both the range where the target rotational speed of the electric pump corresponding to the first segment is the maximum value and the range where the target rotational speed of the electric pump corresponding to the sixth segment is the maximum value are increased, ensuring the stable operation of the electric pump.

The target rotational speed of the electric pump is 0 in the case where the duty cycle of the PWM signal is 0%. When the duty cycle of the PWM signal is in the first segment and the sixth segment, the target rotational speed of the electric pump reaches the maximum rotational speed. Since the duty cycle of the PWM signal is not distinguishable in the first segment and the sixth segment, the target rotational speed of the electric pump in the area where the duty cycle is not easily distinguishable reaches the maximum rotational speed, facilitating the normal operation of the electric pump. When the duty cycle of the PWM signal is in the second and fifth segments, the target rotational speed of the electric pump has a linear relationship with the duty cycle of the PWM signal. When the duty cycle of the PWM signal is in the second segment, the target rotational speed of the electric pump may decrease from the maximum rotational speed to the non-zero minimum rotational speed as the duty cycle of the PWM signal increases. When the duty cycle of the PWM signal is in the fifth segment, the target rotational speed of the electric pump may increase from the non-zero minimum rotational speed to the maximum rotational speed as the duty cycle of the PWM signal increases. The target rotational speed of the electric pump is the non-zero minimum rotational speed in the case where the duty cycle of the PWM signal is in the third segment. When the duty cycle of the PWM signal is in the fourth segment, the fourth segment is the preset duty cycle interval and the target rotational speed of the electric pump is 0. Of course, the target rotational speed of the electric pump corresponding to the third segment and the target rotational speed of the electric pump corresponding to the fourth segment may be exchanged with each other. Compared with the schematic diagram illustrating the correspondence between the duty cycle of the PWM signal and the target rotational speed of the electric pump as illustrated in FIG. 2, the schematic diagram illustrating the correspondence between the duty cycle of the PWM signal and the target rotational speed of the electric pump as illustrated in FIG. 3 includes two linearly varying segments, and two control modes may be selected according to the operating conditions.

In S140, a determination is made as to whether the target rotational speed of the electric pump is equal to 0 and whether the target rotational speed of the electric pump remains equal to 0 for the set duration; if the target rotational speed of the electric pump is equal to 0 and the target rotational speed of the electric pump remains equal to 0 for the set duration, the microcontroller enters the sleep mode; if the target rotational speed of the electric pump is not equal to 0 or the target rotational speed of the electric pump does not remain equal to 0 for the set duration, the microcontroller enters the working mode.

Exemplarily, a duration variable in which the target rotational speed of the electric pump is 0 may be obtained. The duration variable is the duration for which the state where the target rotational speed of the electric pump is 0 lasts. When the duration variable is greater than the set duration, that is, when the duration for which the state where the target rotational speed of the electric pump is 0 lasts is greater than the set duration, the microcontroller enters the sleep mode. That is, when the target rotational speed of the electric pump is 0, the microcontroller enters the sleep mode, causing the peripheral circuits and programs related to the control of the electric pump to stop operating and not to work. At this time, only the core of the microcontroller related to wake-up works, thereby helping reduce the quiescent current of the microcontroller and thus reducing the power consumption of the microcontroller.

In an embodiment, when the duration variable is equal to 4 s, that is, the state where the target rotational speed of the electric pump is equal to 0 lasts for 4 s, and when the duty cycle of the PWM signal and the target rotational speed of the electric pump are both 0, the microcontroller enters the sleep mode, reducing the quiescent current of the microcontroller.

In this embodiment, two conditions under which the target rotational speed of the electric pump is 0 are configured. One is that the duty cycle of the PWM signal is 0%. The other is that a duty cycle interval is preset and the duty cycle of the PWM signal falls in the preset duty cycle interval.

In the case where the condition under which the microcontroller enters the sleep mode is that the duty cycle of the PWM signal is 0%, when the duty cycle of the PWM signal is not equal to 0%, the microcontroller enters the working mode from the sleep mode, that is, the electric pump is controlled to rotate at the target rotational speed corresponding to the duty cycle of the PWM signal. Exemplarily, it is possible to configure the microcontroller to enter the sleep mode in the case where the PWM signal is detected to be always low-level for the set duration. After the microcontroller enters the sleep mode, when the PWM signal is detected to reach a high level, the microcontroller enters the working mode from the sleep mode.

In the case where the condition under which the microcontroller enters the sleep mode is that the duty cycle of the PWM signal falls in the preset duty cycle interval, the duty cycle of the PWM signal is detected every 4 s. If the duty cycle of the PWM signal does not fall in the preset duty cycle interval, and the corresponding target rotational speed of the electric pump is not 0, then the microcontroller enters the working mode from the sleep mode, and the electric pump is controlled to rotate at the target rotational speed corresponding to the duty cycle of the PWM signal. If the duty cycle of the PWM signal does not fall in the preset duty cycle interval, the microcontroller remains in the sleep mode.

Figure 4:
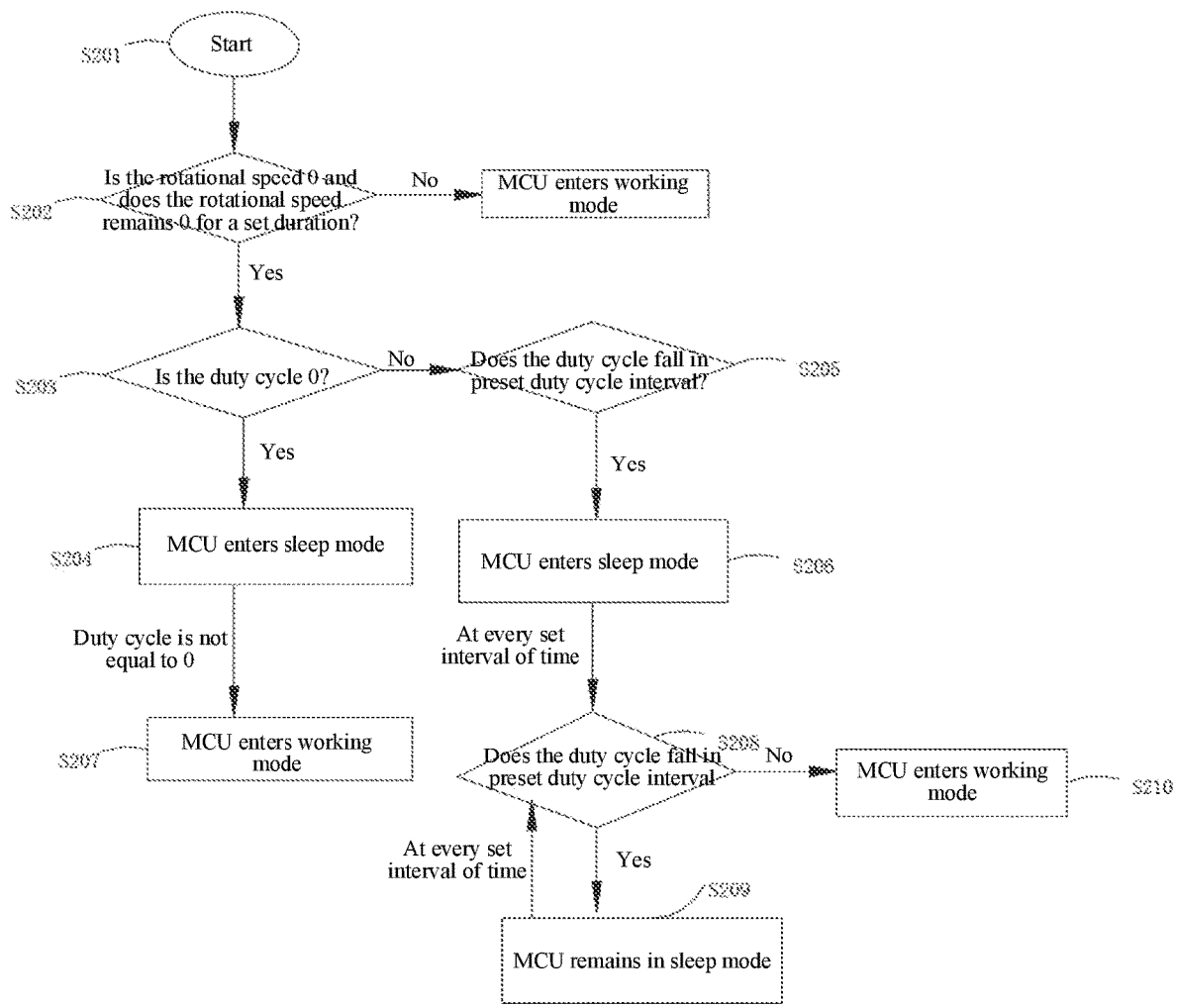
FIG. 4 is a flowchart of another mode control method according to an embodiment of the present disclosure.

FIG. 4 is a flowchart of another mode control method according to an embodiment of the present disclosure. This method can also control an electric pump. A description of the control process of the electric pump is given below by using the mode control method illustrated in FIG. 4 as an example. As illustrated in FIG. 4, the method includes the steps below.

In S201, the process starts. This step includes the initialization and/or power-on of the electric pump.

In S202, a determination is made regarding whether the target rotational speed of the electric pump is equal to 0 and whether the state where the target rotational speed of the electric pump is equal to 0 lasts for a set duration; if the target rotational speed of the electric pump is equal to 0 and the state that target rotational speed of the electric pump is equal to 0 lasts for the set duration, the process goes to S203; if the target rotational speed of the electric pump is not equal to 0 or the state that the target rotational speed of the electric pump is equal to 0 does not last for the set duration, the microcontroller enters the working mode, the electric pump rotates, and the target rotational speed of the electric pump is determined according to the duty cycle of a PWM signal.

In S203, a determination is made regarding whether the duty cycle of the PWM signal is 0%; if the duty cycle of the PWM signal is not 0%, the process goes to S204; if not, the process goes to S205.

In S204, the electric pump stops rotating and the microcontroller enters the sleep mode.

In S205, a determination is made as to whether the duty cycle of the PWM signal falls in the preset duty cycle interval; if the duty cycle of the PWM signal falls in the preset duty cycle interval, the process goes to S206.

In S206, the electric pump stops rotating and the microcontroller enters the sleep mode.

After S204, S207 is included.

In S207, the microcontroller enters the working mode from the sleep mode. The condition under which the process goes to S207 is that the duty cycle of the PWM signal is not equal to 0%.

After S206, S208 is included.

In S208, a determination is made as to whether the duty cycle of the PWM signal falls in the preset duty cycle interval; if yes, the process goes to S209; if not, the process goes to S210.

In S209, the microcontroller is in the sleep mode.

In S210, the microcontroller enters the working mode from the sleep mode.

The condition under which the process goes from S206 to S208 is a predetermined interval of time.

The preceding set duration is obtained in the following manner.

A first clock signal is initialized.

The first clock signal is acquired and initialized. For example, the first clock signal may be set to Stop_time1, and Stop_time1 is set to 0.

The first clock signal performs timing.

When the target rotational speed of the electric pump is 0, the first clock signal starts timing, that is, the first clock signal indicates the duration for which the target rotational speed of the electric pump is 0. Exemplarily, is may be used as the timing unit, and timing of the first clock signal is Stop_time1++.

A determination is made as to whether the first clock signal is greater than or equal to the set duration. For example, the set duration may be set to 4 s.

If yes, that is, the first clock signal is greater than or equal to 4 s, S204 is performed; if not, that is, the first clock signal is less than 4 s, the microcontroller enters the working mode.

The preceding predetermined interval of time is obtained in the following manner.

A second clock signal is initialized.

The second clock signal is acquired and initialized. For example, the second clock signal may be set to Stop_time2, and Stop_time2 is set to 0. The process ends.

After the microcontroller enters the sleep mode, the second clock signal is initialized, where the second clock signal indicates the duration for which the microcontroller is in the sleep mode, that is, Stop_time2 is set to 0, to facilitate wake-up timing of the sleep mode.

A determination is made as to whether the second clock signal is greater than or equal to the set duration. For example, the set duration may be set to 4 s.

If the second clock signal is greater than or equal to the set duration, that is, the second clock signal is equal to 4 s, S208 is performed.

After the microcontroller of the electric pump enters the sleep mode through S205, the duty cycle of the PWM signal may be detected every predetermined interval of time. The predetermined interval of time may be 4 s. The duty cycle of the PWM signal may be detected every 4 s. With reference to FIGS. 2 and 3, if the duty cycle of the PWM signal falls in the preset duty cycle interval, the target rotational speed of the electric pump is 0 and the microcontroller is in the sleep mode, reducing the quiescent current of the microcontroller. If the duty cycle of the PWM signal does not fall in the preset duty cycle interval and the target rotational speed of the electric pump is not 0, the microcontroller enters the working mode from the sleep mode.

Figure 5:
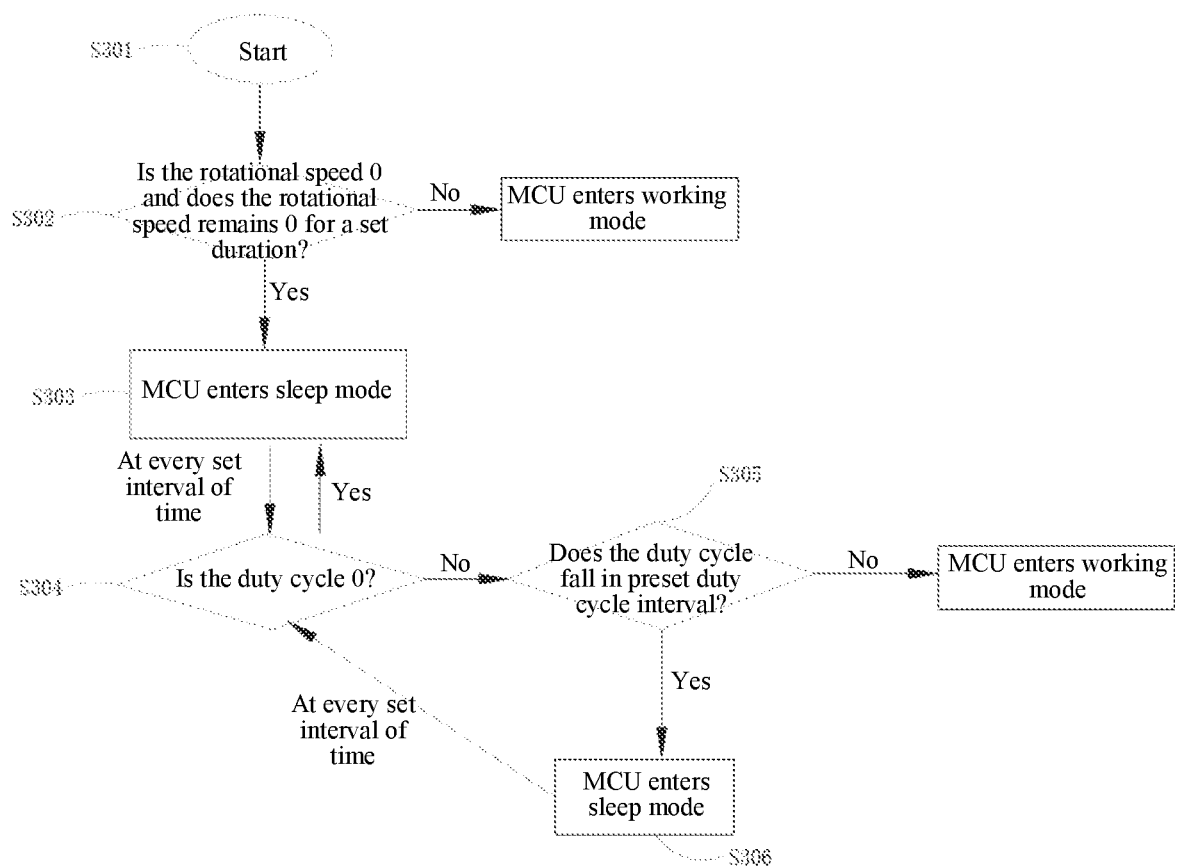
FIG. 5 is a flowchart of another mode control method according to an embodiment of the present disclosure.

FIG. 5 is a flowchart of another mode control method according to an embodiment of the present disclosure. This method can also control an electric pump. A description of the control process of the electric pump is given below by using the method illustrated in FIG. 5 as an example. As illustrated in FIG. 5, the method includes the steps below.

In S301, the process starts. This step includes the initialization and/or power-on of the electric pump.

In S302, a determination is made as to whether the target rotational speed of the electric pump is equal to 0 and whether the state where the target rotational speed of the electric pump is equal to 0 lasts for a set duration; if the target rotational speed of the electric pump is equal to 0 and the target rotational speed of the electric pump remains equal to 0 for the set duration, the process goes to S303; if the target rotational speed of the electric pump is not equal to 0 and the target rotational speed of the electric pump does not remain equal to 0 for the set duration, the microcontroller enters the working mode, the electric pump rotates, and the target rotational speed of the electric pump is determined based on the duty cycle of a PWM signal.

In S303, the microcontroller enters the sleep mode.

In S304, a determination is made as to whether the duty cycle of the PWM signal is 0%; if the duty cycle of the PWM signal is 0%, the process goes to S303; if the duty cycle of the PWM signal is not 0%, the process goes to S305. The condition under which the process goes from S303 to S304 is a predetermined interval of time.

In S305, a determination is made as to a determination is made as to whether the target rotational speed of the electric pump falls in the preset duty cycle interval; if the target rotational speed of the electric pump falls in the preset duty cycle interval, the process goes to S306; if the target rotational speed of the electric pump does not fall in the preset duty cycle interval, the microcontroller enters the working mode, the electric pump rotates, and the target rotational speed of the electric pump is determined based on the duty cycle of a PWM signal.

In S306, the microcontroller enters the sleep mode.

After S306, S304 is performed after a predetermined interval of time.

The preceding set duration is obtained in the following manner.

A first clock signal is initialized.

The first clock signal is acquired and initialized. For example, the first clock signal may be set to Stop_time1, and Stop_time1 is set to 0.

The first clock signal performs timing.

When the target rotational speed of the electric pump is 0, the first clock signal starts timing, that is, the first clock signal indicates the duration for which the target rotational speed of the electric pump is 0. Exemplarily, is may be used as the timing unit, and timing of the first clock signal is Stop_time1++.

A determination is made as to whether the first clock signal is greater than or equal to the set duration. For example, the set duration may be set to 4 s.

If the first clock signal is greater than or equal to the set duration, that is, the first clock signal is greater than or equal to 4 s, then S303 is performed, that is, the microcontroller enters the sleep mode; if the first clock signal is not greater than or equal to the set duration, that is, the first clock signal is less than 4 s, then the microcontroller enters the working mode.

The preceding predetermined interval of time is obtained in the following manner.

A second clock signal is initialized.

The second clock signal is acquired and initialized. For example, the second clock signal may be set to Stop_time2, and Stop_time2 is set to 0. The process ends.

After the microcontroller enters the sleep mode, the second clock signal is initialized, where the second clock signal indicates the duration for which the microcontroller is in the sleep mode, that is, Stop_time2 is set to 0, to facilitate wake-up timing of the sleep mode.

A determination is made as to whether the second clock signal is greater than or equal to the set duration. For example, the set duration may be set to 4 s.

If the second clock signal is greater than or equal to the set duration, that is, the second clock signal is equal to 4 s, then S306 is performed and the process goes to S304; or S303 is performed and the process goes to S304.

After the microcontroller of the electric pump enters the sleep mode through S305, the duty cycle of the PWM signal may be detected every predetermined interval of time. The predetermined interval of time may be 4 s. The duty cycle of the PWM signal may be detected every 4 s. With reference to FIGS. 2 and 3, if the duty cycle of the PWM signal falls in the preset duty cycle interval, the target rotational speed of the electric pump is 0 and the microcontroller is in the sleep mode, reducing the quiescent current of the microcontroller. If the duty cycle of the PWM signal does not fall in the preset duty cycle interval and the target rotational speed of the electric pump is not 0, the microcontroller enters the working mode from the sleep mode.

Figure 6:
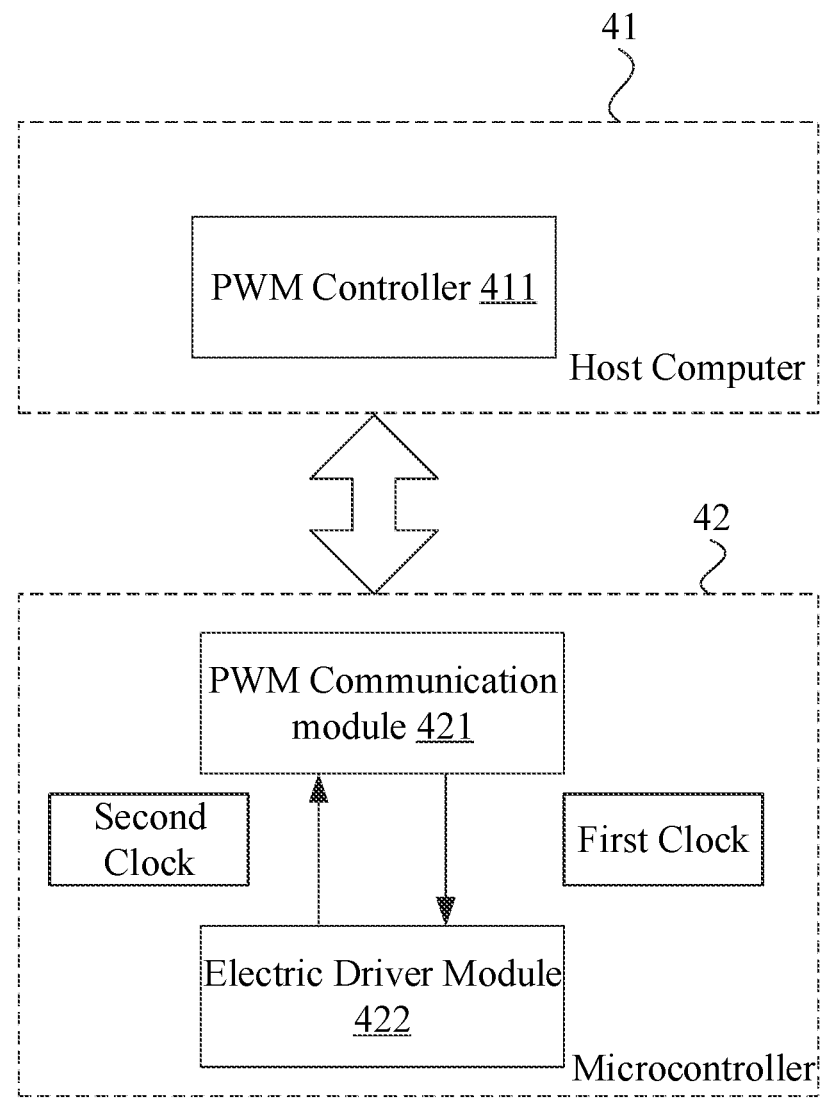
FIG. 6 is a schematic diagram of a mode control system according to an embodiment of the present disclosure.

An embodiment of the present disclosure provides a mode control system. FIG. 6 is a schematic diagram of the mode control system according to this embodiment of the present disclosure. The system can control an electric pump. As illustrated in FIG. 6, the mode control system includes an host computer 41 and a microcontroller 42. The microcontroller 42 is electrically connected to the host computer 41. The host computer 41 includes a PWM controller 411. The PWM controller 411 is configured to send a PWM signal. The microcontroller 42 is configured to receive and parse the PWM signal, to obtain the duty cycle of the PWM signal, and to obtain the target rotational speed of the electric pump according to the duty cycle of the PWM signal. The microcontroller 42 has a prestored control program. After the target rotational speed of the electric pump remains equal to 0 for the set duration, the control program controls the microcontroller 42 to enter the sleep mode.

Exemplarily, the microcontroller 42 may include a PWM communication module 421 and an electric pump driver module 422. The PWM communication module 421 acquires a PWM signal, obtains the duty cycle of the PWM signal according to the PWM signal, and obtains the target rotational speed of the electric pump according to the duty cycle of the PWM signal. The electric pump driver module 422 controls the electric pump to rotate according to the target rotational speed of the electric pump. The PWM communication module 421 can also cause the microcontroller 42 to enter the sleep mode after the target rotational speed of the electric pump remains equal to 0 for the set duration. The electric pump driver module 422 can also collect a PWM signal fed back by the electric pump. The PWM communication module 421 can adjust the ratio of the low level in the feedback PWM signal to a normal communication signal and can obtain the real-time status of the electric pump according to the ratio of the low level in the feedback PWM signal to the normal communication signal.

Exemplarily, when the target rotational speed of the electric pump remains equal to 0 for the set duration and the duty cycle of the PWM signal is 0%, the microcontroller 42 enters the working mode; when the duty cycle of the PWM signal is not equal to 0, the microcontroller 42 enters the working mode from the sleep mode.

Exemplarily, when the duty cycle of the PWM signal is not 0% and the target rotational speed of the electric pump is 0, the microcontroller 42 enters the sleep mode. Every set interval of time, the operating mode of the microcontroller is determined according to the duty cycle of the PWM signal. When the target rotational speed of the electric pump remains equal to 0 for the set duration and the duty cycle of the PWM signal is not 0%, the microcontroller enters the sleep mode. When the duty cycle of the PWM signal is outside the duty cycle interval, the microcontroller enters the working mode from the sleep mode.

In the mode control method and system provided in embodiments of the present disclosure, a PWM signal is acquired, the duty cycle of the PWM signal is obtained according to the PWM signal, the target rotational speed of the electric pump is obtained according to the duty cycle of the PWM signal, the microcontroller enters the sleep mode after the target rotational speed of the electric pump remains equal to 0 for the set duration, and the microcontroller can enter the sleep mode when the electric pump stops rotating, causing the peripheral circuits and programs related to the control of the electric pump to stop operating and not to work. At this time, only the core of the microcontroller related to wake-up works, thereby helping reduce the quiescent current of the microcontroller and thus reducing the power consumption of the microcontroller.

Figure 7:
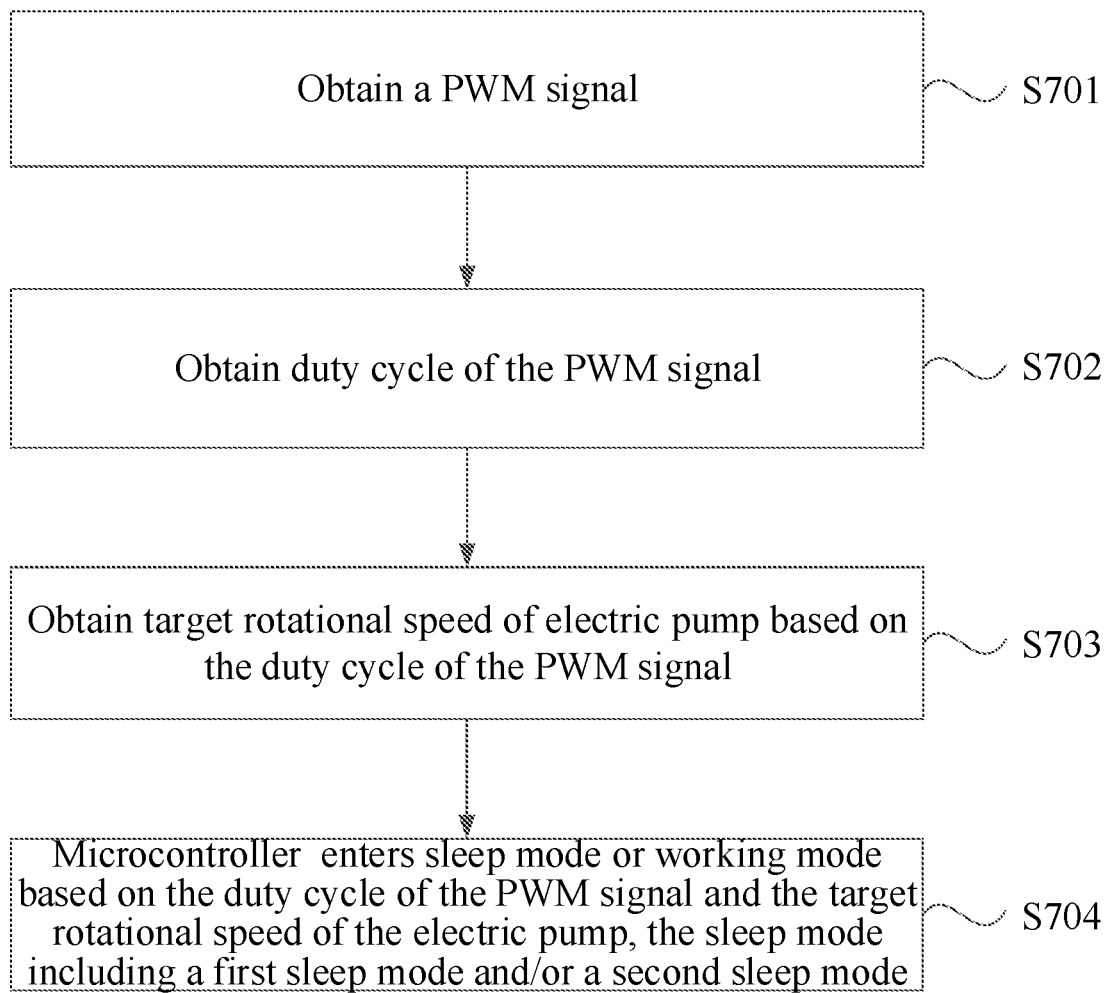
FIG. 7 is a flowchart of another mode control method according to an embodiment of the present disclosure.

FIG. 7 is a flowchart of another mode control method according to an embodiment of the present disclosure. The solution of this embodiment is applicable to the scenario of controlling an electric pump and is executable by a mode control system provided in embodiments of the present disclosure. For example, the solution is executable by a microcontroller in the mode control system. The mode control system can be implemented by software and/or hardware. The method includes the steps below.

In S701, a PWM signal is acquired.

In an embodiment, a microcontroller autonomous controller (electronic control unit (ECU) or host computer) acquires the PWM signal. Usually the main controller and the microcontroller communicate through a bus, and the microcontroller acquires the PWM signal from the bus.

In S702, the duty cycle of the PWM signal is obtained according to the PWM signal.

In an embodiment, the PWM signal is a pulse-width modulation signal, a square-wave signal containing a low level and a high level. The ratio of the high-level time in the PWM to the cycle of the PWM signal is the duty cycle of the PWM signal. Exemplarily, the PWM signal may be sent by a PWM signal controller, which may be integrated in the main controller of the electric pump, the microcontroller can receive and process the PWM signal, the microcontroller can also generate a feedback signal, and the microcontroller can obtain the duty cycle of the PWM signal according to the ratio of the high-level time in the received PWM signal to the cycle of the PWM signal.

In S703, the target rotational speed of the electric pump is obtained based on the duty cycle of the PWM signal.

Exemplarily, the target rotational speed of the electric pump may be obtained according to the duty cycle of the PWM signal in the manner of table lookup. As illustrated in FIG. 2, in this embodiment, the duty cycle of the PWM signal includes 5 segments. An interval greater than 0% and less than or equal to a first duty cycle is a first segment, an interval greater than the first duty cycle and less than or equal to a second duty cycle is a second segment, an interval greater than the second duty cycle and less than or equal to a third duty cycle is a third segment, an interval greater than the third duty cycle and less than or equal to a fourth duty cycle is a fourth segment, and an interval greater than the fourth duty cycle and less than or equal to 100% is a fifth segment.

The target rotational speed of the electric pump is 0 in the case where the duty cycle is 0%. When the duty cycle of the PWM signal is in the first segment and the fifth segment, the target rotational speed of the electric pump reaches the maximum rotational speed. Since the duty cycle of the PWM signal is not easily distinguishable in the first segment and the fifth segment, the target rotational speed of the electric pump corresponding to the area of the first segment and the target rotational speed of the electric pump corresponding to the area of the fifth segment reach the maximum rotational speed, facilitating the normal operation of the electric pump. When the duty cycle of the PWM signal is in the second segment, the second segment is the preset duty cycle interval and the target rotational speed is 0. In this embodiment, the first duty cycle is set to 7%, and the second duty cycle is set to 12%. That is, when the duty cycle of the PWM signal is greater than 7% and less than or equal to 11%, the target rotational speed of the electric pump is 0. When the duty cycle of the PWM signal is in the third segment, the target rotational speed of the electric pump is the non-zero minimum rotational speed. In this embodiment, the third duty cycle is set to 18%. When the duty cycle of the PWM signal is in the fourth segment, the target rotational speed of the electric pump has a linear relationship with the duty cycle of the PWM signal. That is, in the fourth segment, the target rotational speed of the electric pump linearly increases from the non-zero minimum rotational speed to the maximum rotational speed. In this embodiment, the fourth duty cycle is set to 93%.

Thus, after the duty cycle of the PWM signal is obtained, the target rotational speed of the electric pump may be obtained according to the duty cycle of the PWM signal with reference to FIG. 2 in the manner of table lookup. Of course, the second segment may also be configured between the third segment and the fourth segment or between the fourth segment and the fifth segment as required. In this embodiment, the rotational speed of the electric pump corresponding to the duty cycle of the PWM signal corresponding to the second segment is set to 0, and the electric pump can be controlled by the sent PWM signal corresponding to the second segment to stop rotating, helping satisfy the requirements of multiple operating conditions of the electric pump and control the electric pump according to the circumstances. The second segment is configured between the first segment and the third segment, the rotational speed of the electric pump corresponding to the third, fourth, and fifth segments increases from the non-zero minimum rotational speed to the maximum rotational speed, and the rotational speed is relatively continuous as the duty cycle of the PWM signal increases, helping reduce the difficulty in controlling segmentation. Meanwhile, the non-zero minimum rotational speed and the maximum rotational speed each correspond to a segment of duty cycle of the PWM signal so that the limit to the duty cycle of the PWM signal sent by the main controller is reduced.

In an embodiment, as illustrated in FIG. 3, in this embodiment, the duty cycle of the PWM signal includes 6 segments. An interval greater than 0% and less than or equal to a first duty cycle is a first segment, an interval greater than the first duty cycle and less than or equal to a second duty cycle is a second segment, an interval greater than the second duty cycle and less than or equal to a third duty cycle is a third segment, an interval greater than the third duty cycle and less than or equal to a fourth duty cycle is a fourth segment, an interval greater than the fourth duty cycle and less than or equal to a fifth duty cycle is a fifth segment, and an interval greater than the fifth duty cycle and less than or equal to 100% is a sixth segment. In this embodiment, the first duty cycle is 10%, the second duty cycle is 40%, the third duty cycle is 50%, the fourth duty cycle is 60%, and the fifth duty cycle is 90%. Compared with the schematic diagram illustrating the correspondence between the duty cycle of the PWM signal and the target rotational speed of the electric pump as shown in FIG. 2, the value of the first duty cycle increases slightly, and the value of the fifth duty cycle is slightly less than that of the fourth duty cycle. In this manner, the length of the first segment and the length of the sixth segment can be further enlarged so that both the range where the target rotational speed of the electric pump corresponding to the first segment is the maximum value and the range where the target rotational speed of the electric pump corresponding to the sixth segment is the maximum value are increased, ensuring the stable operation of the electric pump.

The target rotational speed of the electric pump is 0 in the case where the duty cycle is 0%. When the duty cycle of the PWM signal is in the first segment and the sixth segment, the target rotational speed of the electric pump reaches the maximum rotational speed. Since the duty cycle of the PWM signal is not easily distinguishable in the first segment and the sixth segment, the target rotational speed of the electric pump corresponding to the area of the first segment and the target rotational speed of the electric pump corresponding to the area of the sixth segment reach the maximum rotational speed, facilitating the normal operation of the electric pump. When the duty cycle of the PWM signal is in the second and fifth segments, the target rotational speed of the electric pump has a linear relationship with the duty cycle of the PWM signal. When the duty cycle of the PWM signal is in the second segment, the target rotational speed of the electric pump decreases from the maximum rotational speed to the non-zero minimum rotational speed as the duty cycle of the PWM signal increases. When the duty cycle of the PWM signal is in the fifth segment, the target rotational speed of the electric pump increases from the non-zero minimum rotational speed to the maximum rotational speed as the duty cycle of the PWM signal increases. The target rotational speed of the electric pump is the non-zero minimum rotational speed in the case where the duty cycle of the PWM signal is in the third segment. When the duty cycle of the PWM signal is in the fourth segment, the target rotational speed of the electric pump is 0. In this embodiment, the fourth segment is the preset duty cycle interval. Of course, the target rotational speed of the electric pump corresponding to the third segment and the target rotational speed of the electric pump corresponding to the fourth segment may be exchanged with each other. Compared with the schematic diagram illustrating the correspondence between the duty cycle of the PWM signal and the target rotational speed of the electric pump as illustrated in FIG. 2, the schematic diagram illustrating the correspondence between the duty cycle of the PWM signal and the target rotational speed of the electric pump as shown in FIG. 3 includes two linearly varying segments, and two control modes may be selected according to the operating conditions.

In S704, the microcontroller enters the sleep mode or the working mode according to the duty cycle of the PWM signal and the target rotational speed of the electric pump. The sleep mode includes a first sleep mode and/or a second sleep mode.

When the target rotational speed of the electric pump remains equal to 0 for the set duration and the duty cycle of the PWM signal is 0%, the microcontroller enters the first sleep mode.

When the target rotational speed of the electric pump remains equal to 0 for the set duration, the duty cycle of the PWM signal is not 0%, and the duty cycle of the PWM signal falls in the preset duty cycle interval, the microcontroller enters the second sleep mode.

Exemplarily, when the target rotational speed of the electric pump is 0, the electric pump is not rotating, and the microprocessor is in the working mode or the sleep mode, a duration variable in which the target rotational speed of the electric pump is 0 may be obtained. The duration variable is the duration for which the state where the target rotational speed of the electric pump is 0 lasts. When the duration variable is greater than the set duration, that is, when the duration for which the state where the target rotational speed of the electric pump is 0 lasts is greater than the set duration, the microcontroller enters the sleep mode or remains in the sleep mode. That is, when the target rotational speed of the electric pump is 0, the microcontroller enters the sleep mode or remains in the sleep mode, causing the circuits and programs related to the control of the rotational speed the electric pump to stop operating and not to work, thereby helping reduce the quiescent current of the microcontroller and thus reducing the power consumption of the microcontroller.

Meanwhile, in this embodiment, two sleep modes are included, different sleep modes may be selected for different operating conditions, and one of the sleep modes may be controlled during one operating process.

TABLE 1

Figure 8:
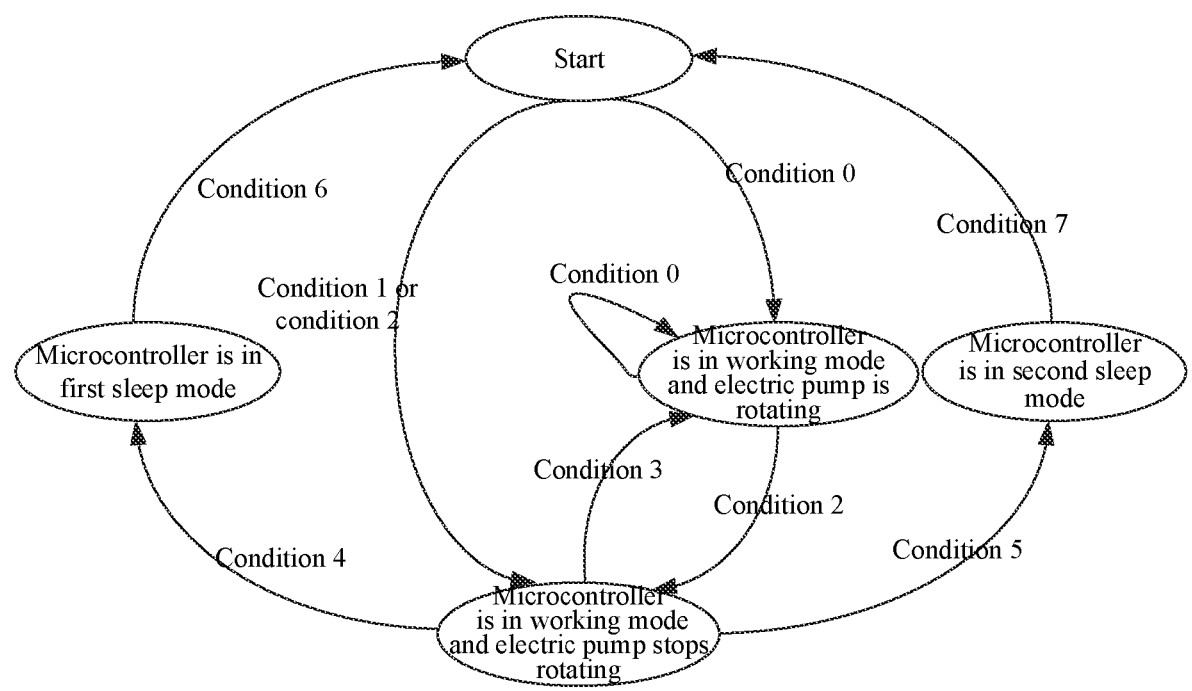
FIG. 8 is a schematic diagram illustrating state switching according to an embodiment of the present disclosure.

State switching conditions for the state switching diagram shown in FIG. 8

| | Duration variable (s) | Duty Cycle of PWM Signal (%) | Target Rotational Speed of Electric Pump (r/s) |
|---|---|---|---|
| Condition 0 | 0 | Not equal to 0 | Not equal to 0 |
| Condition 1 | 0 | Greater than or equal to 8 and less than or equal to 11 | 0 |
| Condition 2 | 0 | 0 | 0 |
| Condition 3 | Less than 4 | Not equal to 0 | Not equal to 0 |
| Condition 4 | 4 | 0 | 0 |
| Condition 5 | 4 | Greater than or equal to 8 and less than or equal to 11 | 0 |
| Condition 6 | 0 | Not equal to 0 | 0 |
| Condition 7 | 4 | Greater than or equal to 8 and less than or equal to 11 | 0 |

FIG. 8 is a schematic diagram illustrating state switching according to an embodiment of the present disclosure. Table 1 lists state switching conditions for the state switching diagram shown in FIG. 8. With reference to FIG. 8 and Table 1, when the target rotational speed of the electric pump remains equal to 0 for the set duration and the duty cycle of the PWM signal is 0%, the microcontroller enters the sleep mode. For ease of description, the sleep mode entered under this condition is defined as a first sleep mode. When the electric pump in the stop rotating state satisfies condition 4, that is, the duration variable is equal to 4 s, that is, the state where the target rotational speed of the electric pump is equal to 0 lasts for 4 s, and when the duty cycle of the PWM signal and the target rotational speed of the electric pump are both 0, the microcontroller enters the first sleep mode. In this way, when the target rotational speed of the electric pump is 0, the microcontroller is in the first sleep mode, reducing the quiescent current of the microcontroller.

With reference to FIG. 8 and Table 1, after the microcontroller enters the first sleep mode, the working state of the microcontroller may be controlled according to the duty cycle of the PWM signal. When the duty cycle of the PWM signal is not equal to 0%, the microcontroller enters the working mode from the first sleep mode, that is, when the electric pump in the first sleep mode satisfies condition 6, that is, the duty cycle of the PWM signal is not equal to 0%, the microcontroller enters the working mode from the first sleep mode, that is, the electric pump is powered on.

Exemplarily, it is feasible to configure the microcontroller to enter the first sleep mode in the case where the PWM signal is detected to be always low-level for the set duration. After the microcontroller enters the first sleep mode, when the PWM signal is detected to reach a high level, the microcontroller in the first sleep mode is waked up to enter the working mode from the first sleep mode.

With reference to FIG. 8 and Table 1, in one case, when the target rotational speed of the electric pump remains equal to 0 for the set duration, the duty cycle of the PWM signal is not 0%, and the duty cycle of the PWM signal falls in the duty cycle interval bounded by a first duty cycle and a second duty cycle, the microcontroller enters the sleep mode. To distinguish between different conditions for entering the sleep mode, the sleep mode entered under this condition is defined as a second sleep mode. In an embodiment, when the electric pump in the stop rotating state satisfies condition 5, that is, the state where the target rotational speed of the electric pump is equal to 0 lasts for 4 s, and when the duty cycle of the PWM signal falls in the duty cycle interval bounded by the first duty cycle and the second duty cycle, the microcontroller enters the second sleep mode. Exemplarily, here the first duty cycle is set to 8% and the second duty cycle is set to 11%. Thus, the duty cycle interval bounded by the first duty cycle and the second duty cycle is an interval greater than or equal to 8% and less than or equal to 11%. With reference to FIG. 2, FIG. 8 and Table 1, at this time, the target rotational speed of the electric pump is 0 and the microcontroller is in the second sleep mode, reducing the quiescent current of the microcontroller.

With reference to FIG. 8 and Table 1, in another case, after the microcontroller enters the working mode from the first sleep mode, when the target rotational speed of the electric pump remains equal to 0 for the set duration, the duty cycle of the PWM signal is not 0%, and the duty cycle of the PWM signal falls in the duty cycle interval bounded by a first duty cycle and a second duty cycle, the microcontroller enters the second sleep mode. Unlike the previous case where the microcontroller enters the second sleep mode directly from the working mode without experiencing the first sleep mode, here the controller enters the first sleep mode, then enters the working mode, and then enters the second sleep mode. In an embodiment, when the electric pump in the first sleep mode satisfies condition 6, the microcontroller enters the working mode from the first sleep mode, that is, the electric pump is powered on; and then when the electric pump in the stop rotating state satisfies condition 5, that is, the state where the target rotational speed of the electric pump is equal to 0 lasts for 4 s, and when the duty cycle of the PWM signal is not 0% and the duty cycle of the PWM signal falls in the duty cycle interval bounded by the first duty cycle and the second duty cycle, the microcontroller enters the second sleep mode, reducing the quiescent current of the microcontroller.

With reference to FIG. 8 and Table 1, in the preceding two cases, that is, no matter in the case where the microcontroller enters the second sleep mode directly from the working mode without experiencing the first sleep mode or in the case where the microcontroller enters the first sleep mode, then enters the working mode, and then enters the second sleep mode, a determination is made as to whether the duty cycle of the PWM signal falls in the preset duty cycle interval every set interval of time. If yes, the microcontroller remains in the second sleep mode. If not, the microcontroller enters the working mode from the second sleep mode. In an embodiment, when the duty cycle of the PWM signal falls in the duty cycle interval bounded by the first duty cycle and the second duty cycle, the microcontroller remains in the second sleep mode; when the duty cycle of the PWM signal is outside the duty cycle interval bounded by the first duty cycle and the second duty cycle, the microcontroller enters the working mode from the second sleep mode.

Exemplarily, here the first duty cycle is also set to 8% and the second duty cycle is also set to 11%. Thus, here the duty cycle interval bounded by the first duty cycle and the second duty cycle is also an interval greater than or equal to 8% and less than or equal to 11%. The duty cycle of the PWM signal may be detected every 4 s. With reference to FIG. 2, FIG. 8 and Table 1, if the duty cycle of the PWM signal is greater than or equal to 8% and less than or equal to 11%, then the target rotational speed of the electric pump is 0 (corresponding to condition 5) and the microcontroller enters the second sleep mode, reducing the quiescent current of the microcontroller. If the duty cycle of the PWM signal is outside the duty cycle interval bounded by the first duty cycle and the second duty cycle, that is, the duty cycle of the PWM signal is less than 8% or greater than 11%, then the target rotational speed of the electric pump is not 0 (corresponding to condition 7) and the microcontroller is waked up from the second sleep mode and enters the working mode from the second sleep mode.

With reference to FIG. 8 and Table 1, after the microcontroller enters the working mode from the second sleep mode, when the target rotational speed of the electric pump remains equal to 0 for the set duration and the duty cycle of the PWM signal is 0%, the microcontroller enters the first sleep mode. In an embodiment, after the microcontroller enters the working mode from the second sleep mode, when the electric pump in the stop rotating state satisfies condition 4 and the duty cycle of the PWM signal and the target rotational speed of the electric pump are both 0, the microcontroller enters the first sleep mode. In this manner, when the target rotational speed of the electric pump is 0, the microcontroller is in the first sleep mode, reducing the quiescent current of the microcontroller. After the microcontroller enters the first sleep mode, when the duty cycle of the PWM signal is not equal to 0%, the microcontroller enters the working mode from the first sleep mode.

With reference to FIG. 8 and Table 1, when the target rotational speed of the electric pump is not equal to 0, the microcontroller enters the working mode and the electric pump enters the rotation mode (corresponding to condition 0), that is, the electric pump is powered on. When the target rotational speed of the electric pump is not equal to 0, the target rotational speed of the electric pump is determined according to the duty cycle of the PWM signal, and the rotational speed of the electric pump is controlled according to the target rotational speed. When the target rotational speed of the electric pump is equal to 0, the electric pump enters the rotation stop mode from the rotation mode (corresponding to conditions 1 and 2) and the microcontroller enters the sleep mode or the microcontroller enters the sleep mode from the working mode (corresponding to conditions 4 and 5). With reference to FIG. 2, when the duty cycle of the PWM signal is equal to 0%, the target rotational speed of the electric pump is equal to 0 and the electric pump is controlled to enter the rotation mode from the rotation stop mode. When the duty cycle of the PWM signal is greater than or equal to 8% and less than or equal to 11%, the target rotational speed of the electric pump is equal to 0 and the electric pump is also controlled to enter the rotation mode from the rotation stop mode. When the target rotational speed of the electric pump is equal to 0 for less than the set duration, that is, when the duty cycle of the PWM signal is not equal to 0% and the target rotational speed of the electric pump is not equal to 0 within the set duration, the electric pump is controlled to re-enter the rotation stop mode from the rotation mode (corresponding to condition 3). For example, when the target rotational speed of the electric pump is equal to 0 for less than 4 s, that is, when the duty cycle of the PWM signal changes within 4 s after the electric pump enters the rotation stop mode and this change causes the target rotational speed of the electric pump to be not equal to 0, the electric pump is controlled to re-enter the rotation mode from the rotation stop mode.

Figure 9:
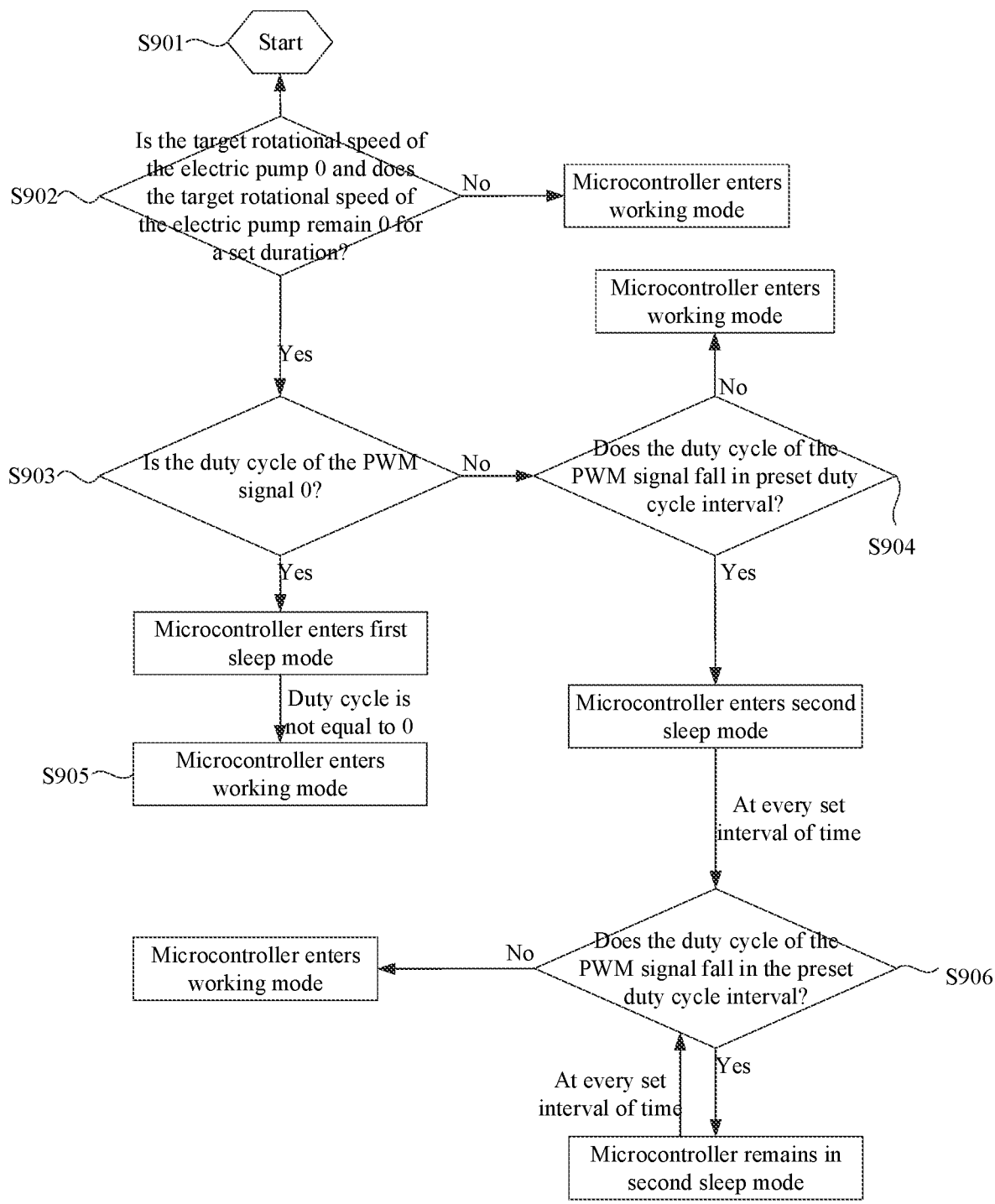
FIG. 9 is a flowchart of another mode control method according to an embodiment of the present disclosure.

FIG. 9 is a flowchart of another mode control method according to an embodiment of the present disclosure. This method can also control an electric pump. A description of the control process of the electric pump is given below by using the method illustrated in FIG. 9 as an example. As shown in FIG. 9, the method includes the steps below.

In S901, the method starts.

This step includes the initialization and/or power-on of the electric pump.

In S902, a determination is made as to whether the target rotational speed of the electric pump is equal to 0 and whether the state where the target rotational speed of the electric pump is equal to 0 lasts for a set duration; if the target rotational speed of the electric pump is equal to 0 and the target rotational speed of the electric pump remains equal to 0 lasts for the set duration, S903 is performed; if the target rotational speed of the electric pump is not equal to 0 and the target rotational speed of the electric pump does not remain equal to 0 lasts for the set duration, the microcontroller enters the working mode, the electric pump rotates, and the target rotational speed of the electric pump is determined based on the duty cycle of a PWM signal.

In S903, a determination is made as to whether the duty cycle of the PWM signal is 0; if the duty cycle of the PWM signal is 0, the microcontroller enters a first sleep mode and the electric pump stops rotating; if the duty cycle of the PWM signal is not 0, the process goes to S904.

In S904, a determination is made as to whether the duty cycle of the PWM signal falls in the preset duty cycle interval; if the duty cycle of the PWM signal falls in the preset duty cycle interval, the microcontroller enters a second sleep mode and the electric pump stops rotating; if the duty cycle of the PWM signal does not fall in the preset duty cycle interval, the microcontroller enters the working mode.

After the microcontroller enters the first sleep mode, S905 is included.

In S905, the microcontroller enters the working mode from the first sleep mode.

The condition under which S905 is performed is that the duty cycle of the PWM signal is not equal to 0.

After the microcontroller enters the second sleep mode, S906 is included.

In S906, a determination is made as to whether the duty cycle of the PWM signal falls in the preset duty cycle interval; if the duty cycle of the PWM signal falls in the preset duty cycle interval, the microcontroller remains in the second sleep mode; if the duty cycle of the PWM signal does not fall in the preset duty cycle interval, the microcontroller enters the working mode from the second sleep mode. The condition under which S906 is performed is the set interval of time. The preceding set interval of time is obtained in the manner below.

A first clock signal is initialized.

The first clock signal is acquired and initialized. For example, the first clock signal may be set to Stop_time1, and Stop_time1 is set to 0.

A second clock signal is initialized.

The second clock signal is acquired and initialized. For example, the second clock signal may be set to Stop_time2, and Stop_time2 is set to 0. The process ends.

In one case, the first clock signal is configured to perform timing when the duty cycle of the PWM signal is not in the range greater than 0% and less than or equal to a first duty cycle or in the range greater than or equal to a second duty cycle and less than or equal to 100%, the duty cycle of the PWM signal is greater than the first duty cycle and less than the second duty cycle, the electric pump stops rotating, and the target rotational speed of the electric pump is equal to 0.

When the target rotational speed of the electric pump is 0, the first clock signal starts timing, that is, the first clock signal indicates the duration for which the target rotational speed of the electric pump is 0. Exemplarily, is may be used as the timing unit, and timing of the first clock signal is Stop_time1++.

A determination is made as to whether the first clock signal is greater than or equal to the set duration. For example, the set duration may be set to 4 s.

If the first clock signal is greater than or equal to the set duration, that is, the first clock signal is greater than or equal to 4 s, and the duration for which the target rotational speed of the electric pump is equal to 0 is greater than or equal to 4 s, then the microcontroller enters the second sleep mode. In this case, when the target rotational speed of the electric pump is equal to 0, the microcontroller is in the second sleep mode, reducing the quiescent current of the microcontroller. If the first clock signal is not greater than or equal to the set duration, that is, the first clock signal is less than 4 s, and the duration for which the target rotational speed of the electric pump is equal to 0 is less than 4 s, indicating that within 4 s after the electric pump enters the rotation stop mode, the duty cycle of the PWM signal changes so that the target rotational speed of the electric pump is not 0, then the microcontroller enters the working mode and the first clock signal is reinitialized, that is, Stop_time1 is set to 0, so that timing is restarted next time the target rotational speed of the electric pump is 0 and the electric pump stops rotating.

After the electric pump enters the second sleep mode, the first clock signal is initialized, that is, Stop_time1 is set to 0, so that wake-up timing of the second sleep mode can be performed. After the electric pump enters the second sleep mode, the duty cycle of the PWM signal may be detected every predetermined interval of time. The predetermined interval of time may be 4 s. The duty cycle of the PWM signal may be detected every 4 s. With reference to FIG. 2, if the duty cycle of the PWM signal is greater than the first duty cycle and less than the second duty cycle, the target rotational speed of the electric pump is 0 and the microcontroller enters the second sleep mode, reducing the quiescent current of the microcontroller. If the duty cycle of the PWM signal is less than or equal to the first duty cycle or greater than or equal to the second duty cycle and the target rotational speed of the electric pump is not 0, the microcontroller enters the working mode from the second sleep mode.

In another case, the second clock signal is configured to perform timing when the duty cycle of the PWM signal is not in the range greater than 0% and less than or equal to the first duty cycle or in the range greater than or equal to the second duty cycle and less than or equal to 100% and is not in the range greater than the first duty cycle and less than the second duty cycle, the duty cycle of the PWM signal is equal to 0%, and, as shown in FIG. 2, the target rotational speed of the electric pump is equal to 0, and the electric pump stops rotating.

When the target rotational speed of the electric pump is 0, the second clock signal starts timing, that is, the second clock signal indicates the duration for which the target rotational speed of the electric pump is 0. Exemplarily, is may be used as the timing unit, and timing of the second clock signal is Stop_time2++.

A determination is made as to whether the second clock signal is greater than 4 s. If the second clock signal is greater than 4 s, that is, the second clock signal is greater than or equal to 4 s, and the duration for which the target rotational speed of the electric pump is equal to 0 is greater than or equal to 4 s, then the microcontroller enters the first sleep mode. In this case, when the target rotational speed of the electric pump is equal to 0, the microcontroller is in the first sleep mode, reducing the quiescent current of the microcontroller. If the second clock signal is not greater than 4 s, that is, the second clock signal is less than 4 s, and the duration for which the target rotational speed of the electric pump is equal to 0 is less than 4 s, indicating that within 4 s after the electric pump enters the rotation stop mode, the duty cycle of the PWM signal changes so that the target rotational speed of the electric pump is not 0, then the second clock signal is reinitialized, that is, Stop_time2 is set to 0, so that timing is restarted next time the target rotational speed of the electric pump is 0 and the electric pump stops rotating.

After the electric pump enters the first sleep mode, the second clock signal is initialized, that is, Stop_time2 is set to 0, so that wake-up timing of the first sleep mode can be performed.

Figure 10:
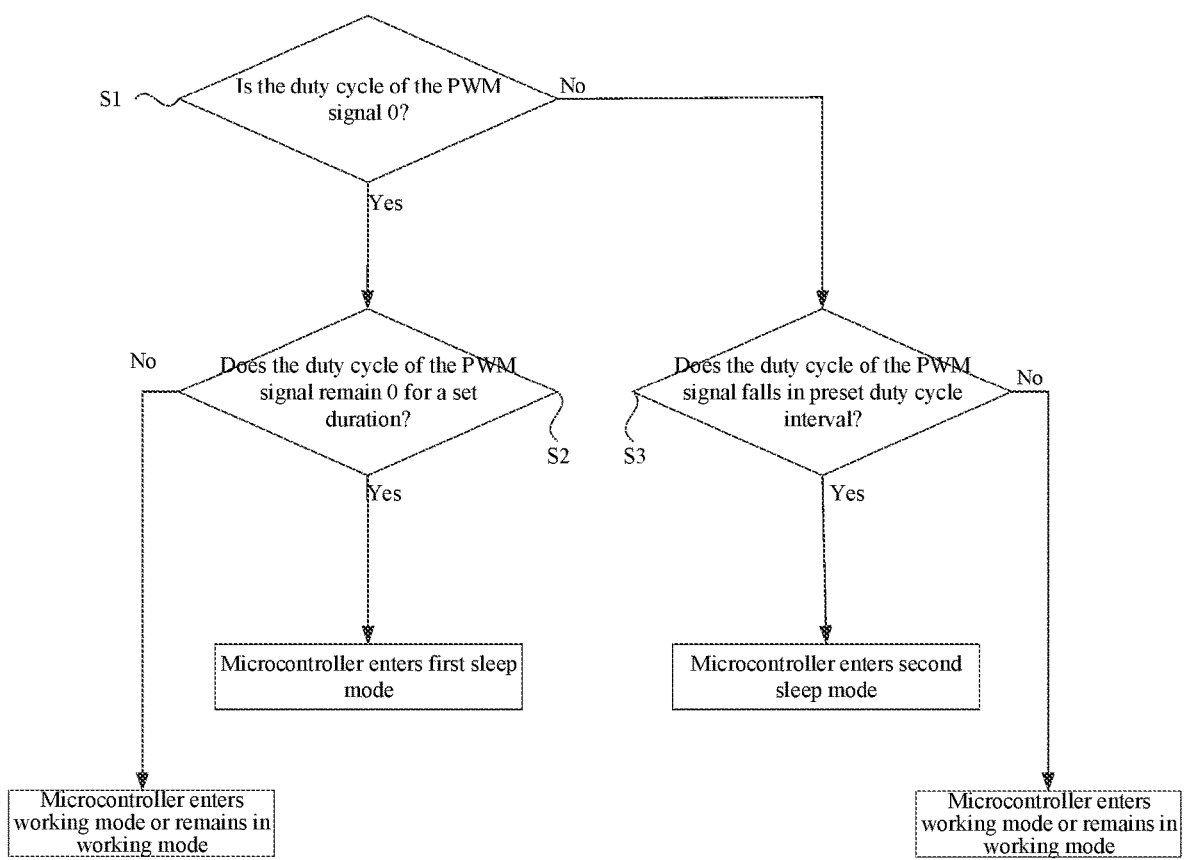
FIG. 10 is a flowchart of another mode control method according to an embodiment of the present disclosure.

The working state of the microcontroller may be controlled according to the duty cycle of the PWM signal. It is feasible to configure the microcontroller to enter the first sleep mode when the detected duty cycle of the PWM signal is always in the low-level state within the set duration. After the microcontroller enters the first sleep mode, when the PWM signal is detected to reach a high level, the microcontroller in the first sleep mode is waked up to enter the working mode from the first sleep mode. FIG. 10 is a flowchart of another mode control method according to an embodiment of the present disclosure. This method can also control an electric pump and may be performed by the mode control system provided in embodiments of the present disclosure. As illustrated in FIG. 10, the method includes the steps below.

In S1, a determination is made as to whether the duty cycle of the PWM signal is 0. If yes, the process goes to S2; if not, the process goes to S3.

In S2, a determination is made as to whether the state where the duty cycle of the PWM signal is 0 lasts for the set duration. If yes, the microcontroller enters a first sleep mode, and the electric pump is not rotating or stops rotating; if not, the microcontroller enters the working mode or remains in the working mode, and the electric pump rotates at the determined target rotational speed.

In S3, a determination is made as to whether the duty cycle of the PWM signal is the preset duty cycle interval. If yes, the microcontroller enters a second sleep mode; if not, the microcontroller enters the working mode or remains in the working mode, and the electric pump rotates at the determined target rotational speed.

Figure 11:
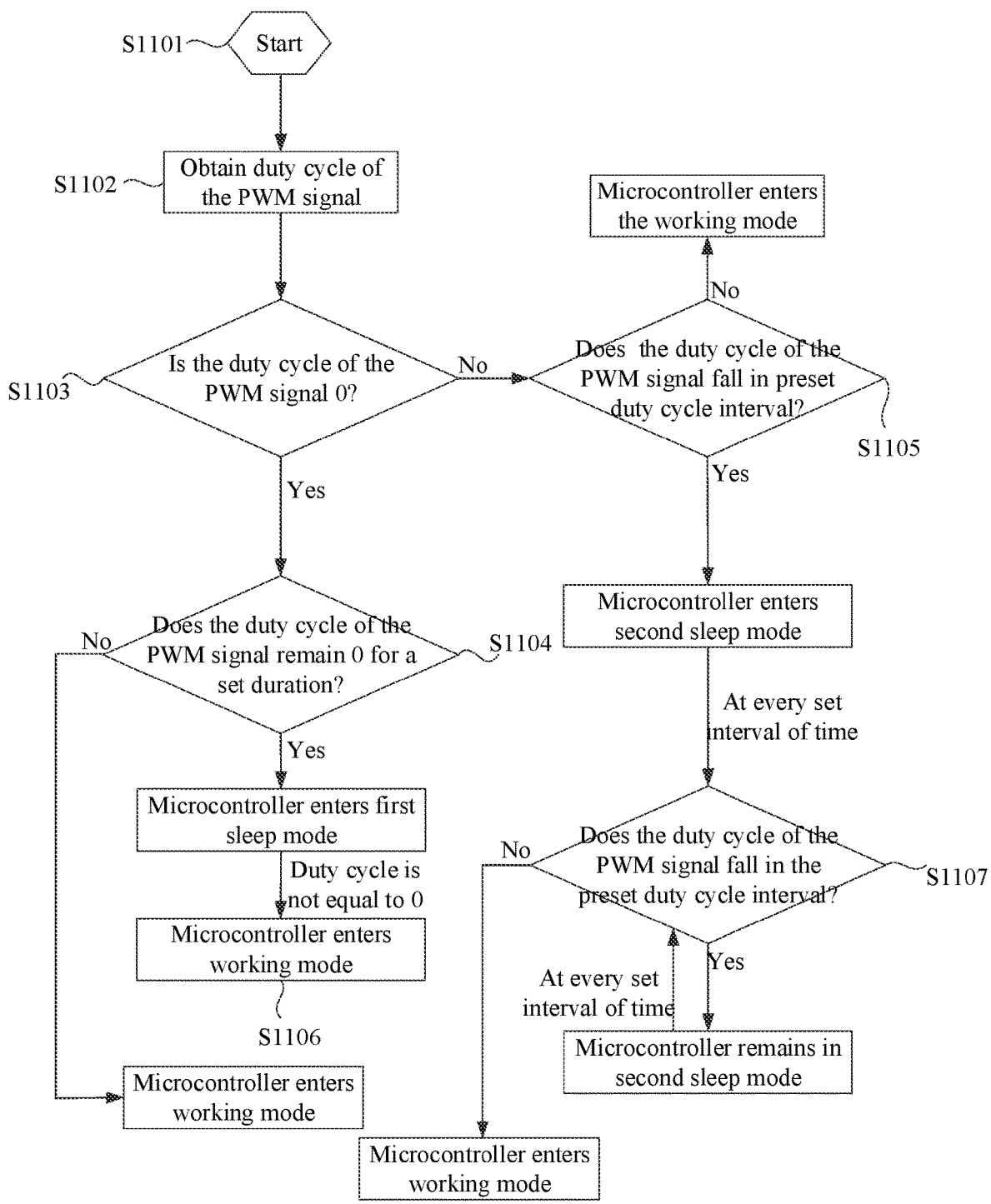
FIG. 11 is a flowchart of another mode control method according to an embodiment of the present disclosure.

FIG. 11 is a flowchart of another mode control method according to an embodiment of the present disclosure. This method can also control an electric pump. A description of the control process of the electric pump is given below by using the mode control method shown in FIG. 11 as an example. As illustrated in FIG. 11, the method includes the steps below.

In S1101, the process starts.

This step includes initialization and/or power-on of the electric pump.

In S1102, the duty cycle of a PWM signal is obtained.

The specific method is the same as above and is not to be repeated here.

In S1103, a determination is made as to whether the obtained duty cycle of the PWM signal is 0. If the obtained duty cycle of the PWM signal is 0, the process goes to S1104; if not, the process goes to S1105.

In S1104, a determination is made as to whether the duty cycle of the PWM signal remains 0 for the set duration.

If the duty cycle of the PWM signal remains 0 for the set duration, the microcontroller enters a first sleep mode, and the electric pump stops rotating; if the duty cycle of the PWM signal does not remain 0 for the set duration, the microcontroller enters the working mode, the electric pump rotates, and the target rotational speed of the electric pump is determined based on the duty cycle of the PWM signal.

In S1105, a determination is made as to whether the duty cycle of the PWM signal falls in the preset duty cycle interval.

If the duty cycle of the PWM signal falls in the preset duty cycle interval, the microcontroller enters a first sleep mode, and the electric pump stops rotating; if the duty cycle of the PWM signal does not fall in the preset duty cycle interval, the microcontroller enters the working mode, the electric pump rotates, and the target rotational speed of the electric pump is determined based on the duty cycle of the PWM signal.

After the microcontroller enters the first sleep mode, S1106 is included.

In S1106, the microcontroller enters the working mode from the first sleep mode.

The condition under which the process goes to S1106 is that the duty cycle of the PWM signal is not equal to 0.

After the microcontroller enters the second sleep mode, S1107 is included.

In S1107, a determination is made as to whether the duty cycle of the PWM signal falls in the preset duty cycle interval.

If the duty cycle of the PWM signal falls in the preset duty cycle interval, the microcontroller remains in the second sleep mode; if the duty cycle of the PWM signal does not fall in the preset duty cycle interval, the microcontroller enters the working mode from the second sleep mode. The condition under which the process goes to S1107 is the set interval of time.

Figure 12:
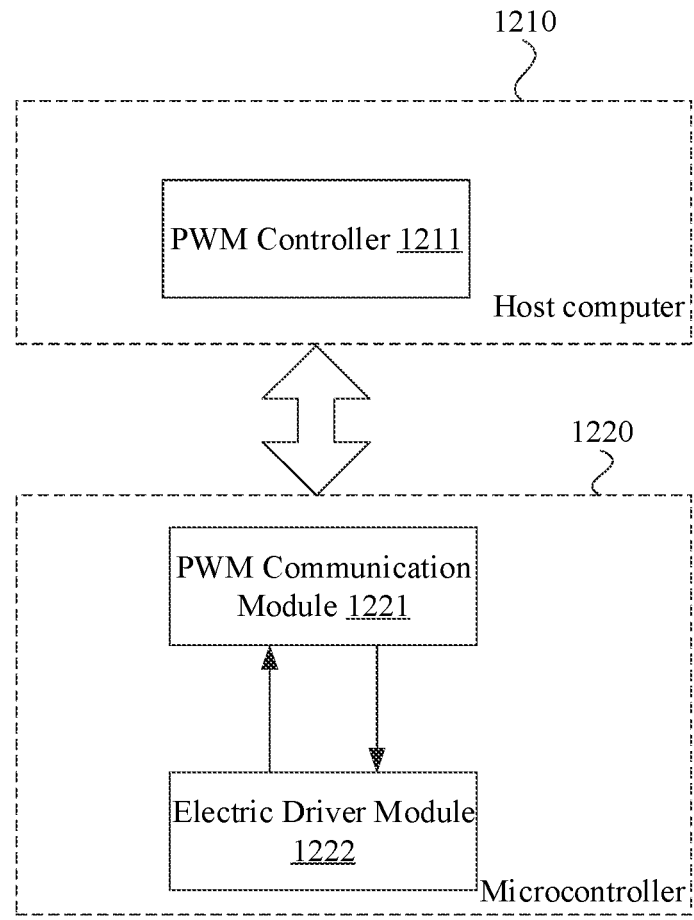
FIG. 12 is a schematic diagram of another mode control system according to an embodiment of the present disclosure.

An embodiment of the present disclosure provides a mode control system. FIG. 12 is a structure diagram of the mode control system according to this embodiment of the present disclosure. The system is configured to control an electric pump. As illustrated in FIG. 12, the mode control system includes an host computer 1210 and a microcontroller 1220. The microcontroller 1220 is electrically connected to the host computer 1210. The host computer 1210 includes a PWM controller 1211. The PWM controller 1211 is configured to send a PWM signal. The microcontroller 1220 is configured to receive and parse the PWM signal, to obtain the duty cycle of the PWM signal, and to obtain the target rotational speed of the electric pump according to the duty cycle of the PWM signal. The microcontroller 1220 has a prestored control program. After the target rotational speed of the electric pump remains equal to 0 for the set duration, the control program controls the microcontroller 1220 to enter the sleep mode.

Exemplarily, the microcontroller 1220 may include a PWM communication module 1221 and an electric pump driver module 1222. The PWM communication module 1221 acquires a PWM signal, obtains the duty cycle of the PWM signal according to the PWM signal, and obtains the target rotational speed of the electric pump according to the duty cycle of the PWM signal. The electric pump driver module 1222 controls the electric pump to rotate according to the target rotational speed of the electric pump. The PWM communication module 1221 can also cause the microcontroller 1220 to enter the sleep mode after the target rotational speed of the electric pump remains equal to 0 for the set duration. The electric pump driver module 1222 can also collect a PWM signal fed back by the electric pump. The PWM communication module 1221 can adjust the ratio of the low level in the feedback PWM signal to a normal communication signal and can obtain the real-time status of the electric pump according to the ratio of the low level in the feedback PWM signal to the normal communication signal.

The microcontroller 1220 enters the working state: the sleep mode or the working mode according to the duty cycle of the PWM signal and the target rotational speed of the electric pump. The sleep mode includes a first sleep mode and/or a second sleep mode. When the target rotational speed of the electric pump remains equal to 0 for the set duration and the duty cycle of the PWM signal is 0%, the microcontroller 1220 enters the first sleep mode. When the target rotational speed of the electric pump remains equal to 0 for the set duration, the duty cycle of the PWM signal is not 0%, and the duty cycle of the PWM signal falls in the duty cycle interval bounded by a first duty cycle and a second duty cycle, the microcontroller 1220 enters the second sleep mode.

After the microcontroller 1220 enters the first sleep mode, when the duty cycle of the PWM signal is not equal to 0%, the microcontroller 1220 enters the working mode from the first sleep mode. After the microcontroller 1220 enters the second sleep mode, the microcontroller 1220 acquires a PWM signal every set interval of time. When the duty cycle of the PWM signal is outside the preset duty cycle interval, the microcontroller 1220 enters the working mode from the second sleep mode.

In the mode control method and system provided in embodiments of the present disclosure, a PWM signal is acquired, the duty cycle of the PWM signal is obtained according to the PWM signal, the target rotational speed of the electric pump is obtained according to the duty cycle of the PWM signal, and the microcontroller enters the sleep mode or the working mode according to the duty cycle of the PWM signal and the target rotational speed of the electric pump. The sleep mode includes a first sleep mode and/or a second sleep mode. When the target rotational speed of the electric pump remains equal to 0 for the set duration and the duty cycle of the PWM signal is 0%, the microcontroller enters the first sleep mode. When the target rotational speed of the electric pump remains equal to 0 for the set duration, the duty cycle of the PWM signal is not 0%, and the duty cycle of the PWM signal falls in the preset duty cycle interval, the microcontroller enters the second sleep mode. In this manner, the microcontroller can enter the first sleep mode and/or the second sleep mode when the electric pump stops rotating. That is, circuits and programs related to the control of the rotational speed of the electric pump are stopped. This greatly reduces the quiescent current of the microcontroller and thus reduces the power consumption of the microcontroller. Meanwhile, it is allowed to select one of the sleep modes according to different requirements, thereby expanding the application scope of the mode control system and method.

Figure 13:
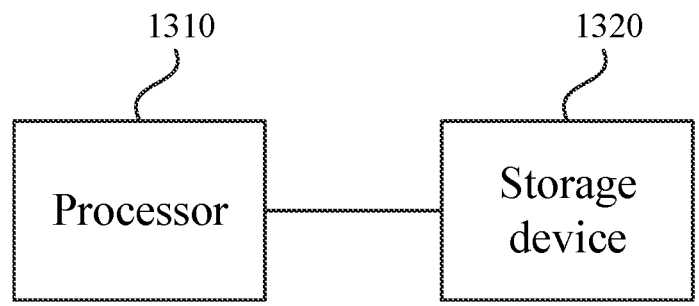
FIG. 13 is a schematic diagram of an electronic device according to an embodiment of the present disclosure.

An embodiment of the present disclosure provides an electronic device. As illustrated in FIG. 13, the electronic device includes one or more processors 1310 and a storage device 1320 configured to store one or more programs. When executed by the one or more processors 1310, the one or more programs cause the one or more processors 1310 to perform the method of any one of the preceding embodiments.

An embodiment of the present disclosure provides a computer-readable storage medium storing one or more computer programs. When the one or more computer programs are executed, the method of any one of the preceding embodiments is performed.

The storage medium is any one or more of various types of memory devices or storage devices. In practical application, the storage medium may be a volatile memory such as a random-access memory (RAM), a non-volatile memory such as a read-only memory (ROM), a flash memory, a hard disk drive (HDD) or a solid state drive (SSD), or a combination thereof, and the storage medium provides instructions and data for a processor.

The storage medium may further include a compact disc read-only memory (CD-ROM), a floppy disk or a magnetic tape device; a computer system memory or a random-access memory such as a dynamic random-access memory (DRAM), a double data rate random-access memory (DDR RAM), a static random-access memory (SRAM), an extended data output random-access memory (EDO RAM), or a Rambus random-access memory (Rambus RAM); a non-volatile memory such as a flash memory or a magnetic medium (such as a hard disk or an optical storage); or another similar type of memory element. The storage medium may further include other types of memories or combinations thereof.

The processor may be at least one of an application-specific integrated circuit (ASIC), a digital signal processor (DSP), a digital signal processing device (DSPD), a programmable logic device (PLD), a field programmable gate array (FPGA), a central processing unit (CPU), a controller, a microcontroller or a microprocessor.

In addition, the storage medium may be located in a first computer system in which programs are executed or may be located in a different second computer system connected to the first computer system through a network such as the Internet. The second computer system may provide program instructions to a first computer, where the program instructions may be executed by the first computer. The term "storage medium" may include two or more storage media which may reside at different positions (for example, in different computer systems connected through a network). The storage medium may store program instructions (for example, computer programs) executable by one or more processors.

What is claimed is:

1. A mode control method, applied to a microcontroller configured to control an electric pump, the mode control method comprising:
   obtaining a pulse-width modulation (PWM) signal;
   obtaining a duty cycle of the PWM signal;
   obtaining a target rotational speed of the electric pump based on the duty cycle of the PWM signal;

determining whether the target rotational speed of the electric pump is equal to 0 and whether that the target rotational speed of the electric pump remains equal to 0 for a set duration;

in response to determining that the target rotational speed of the electric pump is equal to 0 and that the target rotational speed of the electric pump remains equal to 0 for the set duration, entering a sleep mode by the microcontroller; and in response to determining that the target rotational speed of the electric pump is not equal to 0 or the target rotational speed of the electric pump does not remain equal to 0 for the set duration, entering a working mode by the microcontroller;

wherein after the microcontroller enters the sleep mode, the mode control method further comprises:

determining whether the duty cycle of the PWM signal is 0% after a predetermined interval of time;

in response to determining that the duty cycle of the PWM signal is 0%, remaining in the sleep mode by the microcontroller;

in response to determining that the duty cycle of the PWM signal is not 0%, determining whether the duty cycle of the PWM signal falls in a preset duty cycle interval; and in response to determining that the duty cycle of the PWM signal does not fall in the preset duty cycle interval, entering the working mode by the microcontroller.

2. The mode control method of claim 1, further comprising determining whether the duty cycle of the PWM signal obtained by the microcontroller is 0% prior to the microcontroller entering the sleep mode, and determining whether the duty cycle of the PWM signal falls in a duty cycle interval bounded by a first duty cycle and a second duty cycle if the duty cycle of the PWM signal obtained by the microcontroller is not 0%; and if the duty cycle of the PWM signal falls in the duty cycle interval bounded by the first duty cycle and the second duty cycle, the mode control method further comprising the following operations subsequent to the microcontroller entering the sleep mode:

determining whether the duty cycle of the PWM signal falls in the duty cycle interval bounded by the first duty cycle and the second duty cycle at every set interval of time;

in response to determining that the duty cycle of the PWM signal falls in the duty cycle interval bounded by the first duty cycle and the second duty cycle, remaining in the sleep mode by the microcontroller; and in response to determining that the duty cycle of the PWM signal does not fall in the duty cycle interval bounded by the first duty cycle and the second duty cycle, entering the working mode from the sleep mode by the microcontroller.

3. The mode control method of claim 1, further comprising:

in a case where the target rotational speed of the electric pump is 0, controlling, by the microcontroller, the electric pump to enter a stop rotating state, and entering the working mode or the sleep mode by the microcontroller; and obtaining, by the microcontroller, a duration variable denoting that the target rotational speed of the electric pump is 0 where the duration variable is greater than the set duration, entering the sleep mode by the microcontroller.

4. The mode control method of claim 1, wherein the sleep mode comprises at least one of a first sleep mode or a second sleep mode;

in a case where the target rotational speed of the electric pump remains equal to 0 for the set duration and the duty cycle of the PWM signal is 0%, the microcontroller enters the first sleep mode; and in a case where the target rotational speed of the electric pump remains equal to 0 for the set duration, the duty cycle of the PWM signal is not 0%, and the duty cycle of the PWM signal falls in a preset duty cycle interval, the microcontroller enters the second sleep mode.

5. The mode control method of claim 4, further comprising the following operations after the microcontroller enters the second sleep mode:

determining whether the duty cycle of the PWM signal falls in the preset duty cycle interval at every set interval of time;

in response to determining that the duty cycle of the PWM signal falls in the preset duty cycle interval, remaining in the second sleep mode by the microcontroller; and in response to determining that the duty cycle of the PWM signal does not fall in the preset duty cycle interval, entering the working mode from the second sleep mode by the microcontroller.

6. The mode control method of claim 4, further comprising:

when the target rotational speed of the electric pump is 0, entering a stop rotating state by the electric pump, and being in the working mode, the first sleep mode, or the second sleep mode by the microcontroller; and obtaining, by the microcontroller, a duration variable that denotes the target rotational speed of the electric pump is 0 and that is greater than the set duration, entering the first sleep mode or the second sleep mode or remaining in a current sleep mode by the microcontroller.

7. The mode control method of claim 1, further comprising the following operations after obtaining the rotational speed of the electric pump:

in response to determining that the target rotational speed is not equal to 0, entering the working mode by the microcontroller; and in response to determining that the target rotational speed is equal to 0, entering the sleep mode or entering the sleep mode from the working mode by the microcontroller.

8. The mode control method of claim 1, wherein the duty cycle comprises a first duty cycle, a second duty cycle, a third duty cycle, and a fourth duty cycle, wherein an interval greater than 0% and less than or equal to the first duty cycle is defined as a first segment, an interval greater than the first duty cycle and less than or equal to the second duty cycle is defined as a second segment, an interval greater than the second duty cycle and less than or equal to the third duty cycle is defined as a third segment, an interval greater than the third duty cycle and less than or equal to the fourth duty cycle is defined as a fourth segment, and an interval greater than the fourth duty cycle and less than or equal to 100% is defined as a fifth segment, wherein the target rotational speed is 0 when the duty cycle is 0%, the target rotational speed corresponding to the first segment is a maximum rotational speed, the second segment is a preset duty cycle interval, the target rotational speed corresponding to the second segment is 0, the target rotational speed corresponding to the third segment is a non-zero minimum rotational speed, the target rotational speed corresponding to the fourth segment linearly increases from the non-zero minimum rotational speed to the maximum rotational speed, and the target rotational speed corresponding to the fifth segment is the maximum rotational speed.

9. The mode control method of claim 1, wherein the duty cycle comprises a first duty cycle, a second duty cycle, a third duty cycle, a fourth duty cycle and a fifth duty cycle, wherein an interval greater than 0% and less than or equal to the first duty cycle is defined as a first segment, an interval greater than the first duty cycle and less than or equal to the second duty cycle is defined as a second segment, an interval greater than the second duty cycle and less than or equal to the third duty cycle is defined as a third segment, an interval greater than the third duty cycle and less than or equal to the fourth duty cycle is defined as a fourth segment, an interval greater than the fourth duty cycle and less than or equal to the fifth duty cycle is defined as a fifth segment, and an interval greater than the fifth duty cycle and less than or equal to 100% is defined as a sixth segment, wherein the target rotational speed is 0 when the duty cycle is 0%, the target rotational speed corresponding to the first segment is a maximum rotational speed, the target rotational speed corresponding to the second segment linearly decreases from the maximum rotational speed to a non-zero minimum rotational speed, the target rotational speed corresponding to the third segment is the non-zero minimum rotational speed, the target rotational speed corresponding to the fourth segment is a preset duty cycle interval, the target rotational speed corresponding to the fourth segment is 0, the target rotational speed corresponding to the fifth segment linearly increases from the non-zero minimum rotational speed to the maximum rotational speed, and the target rotational speed corresponding to the sixth segment is the maximum rotational speed.

10. A mode control method, applied to a microcontroller configured to control an electric pump, the method comprising:
   S1. determining whether a duty cycle of a pulse-width modulation (PWM) signal is 0; in response to determining that the duty cycle of the PWM signal is 0, performing S2; and in response to determining that the duty cycle of the PWM signal is not 0, performing S3;
   S2. determining whether the duty cycle of the PWM signal remains 0 for a preset duration; in response to determining that the duty cycle of the PWM signal remains 0 for the preset duration, entering a first sleep mode and controlling the electric pump not to rotate or to stop rotating by the microcontroller; and in response to determining that the duty cycle of the PWM signal does not remain 0 for the preset duration, entering a working mode or remaining in the working mode and controlling the electric pump to rotate at a determined target rotational speed by the microcontroller; and
   S3. determining whether the duty cycle of the PWM signal falls in a preset duty cycle interval; in response to determining that the duty cycle of the PWM signal falls in the preset duty cycle interval, entering a second sleep mode by the microcontroller; and in response to determining that the duty cycle of the PWM signal does not fall in the preset duty cycle interval, entering the working mode or remaining in the working mode and controlling the electric pump to rotate at the determined target rotational speed by the microcontroller.

11. The mode control method of claim 10, further comprising:
   determining, by the microcontroller, whether the duty cycle of the PWM signal is equal to 0% after entering the first sleep mode; in response to determining that the duty cycle of the PWM signal is equal to 0%, remaining in the first sleep mode by the microcontroller; and in response to determining that the duty cycle of the PWM signal is not equal to 0%, entering the working mode from the first sleep mode and controlling the electric pump to rotate at the determined target rotational speed by the microcontroller; and
   determining, by the microcontroller, whether the duty cycle of the PWM signal falls in the preset duty cycle interval at every set interval of time after entering the second sleep mode; in response to determining that the duty cycle of the PWM signal falls in the preset duty cycle interval, controlling the microcontroller to remain in the second sleep mode; and in response to determining that the duty cycle of the PWM signal does not fall in the preset duty cycle interval, entering the working mode from the second sleep mode and controlling the electric pump to rotate at the determined target rotational speed by the microcontroller.

12. A mode control system, configured for controlling an electric pump and, the mode control system comprising:
   a host computer, comprising a pulse-width modulation (PWM) controller configured to issue a PWM signal; and
   a microcontroller, electrically connected to the host computer and configured to receive and parse the PWM signal to obtain a duty cycle of the PWM signal and obtain a target rotational speed of the electric pump based on the duty cycle of the PWM signal, wherein
   the microcontroller is further configured to: determine whether the target rotational speed of the electric pump is equal to 0 and determine whether the target rotational speed of the electric pump remains equal to 0 for a set duration; enter a sleep mode in response to determining that the target rotational speed of the electric pump is equal to 0 and the target rotational speed of the electric pump remains equal to 0 for the set duration; and enter a working mode in response to determining that the target rotational speed of the electric pump is not equal to 0 or the target rotational speed of the electric pump does not remain equal to 0 for the set duration;
   wherein after the microcontroller enters the sleep mode, the microcontroller is further configured to:
   determine whether the duty cycle of the PWM signal is 0% after a predetermined interval of time;
   remain in the sleep mode in response to determining that the duty cycle of the PWM signal is 0%;
   determine whether the duty cycle of the PWM signal falls in a preset duty cycle interval; and
   enter the working mode in response to determining that the duty cycle of the PWM signal does not fall in the preset duty cycle interval.

13. The mode control system of claim 12, wherein the control system further comprises a first clock;
   the microcontroller is further configured to obtain a first clock signal and initialize the first clock signal;
   the first clock is configured to start timing and issue the first clock signal when the target rotational speed of the electric pump is 0, the first clock signal denoting a duration that the target rotational speed of the electric pump remains 0; and
   the microcontroller is further configured to determine whether the first clock signal is greater than or equal to the set duration, and determine that the target rotational speed of the electric pump remains equal to 0 for the set duration if the first clock signal is greater than or equal to the set duration.

14. The mode control system of claim 13, further comprising a second clock;
and wherein the microcontroller is further configured to obtain a second clock signal and initialize the second clock signal;
the second clock is configured to start timing and issue the second clock signal in a case wherein the microcontroller enters the sleep mode, the second clock signal denoting a duration that the microcontroller remains in the sleep mode; and
the microcontroller is further configured to determine whether the second clock signal is greater than or equal to the set duration and determine whether the duty cycle of the PWM signal falls in a preset duty cycle interval if the second clock signal is greater than or equal to the set duration.

15. The mode control system of claim 12, wherein the sleep mode comprises at least one of a first sleep mode or a second sleep mode;
the microcontroller is configured to enter the first sleep mode in a case where the target rotational speed of the electric pump remains equal to 0 for the set duration and the duty cycle of the PWM signal is 0%; and
the microcontroller is configured to enter the second sleep mode in a case where the target rotational speed of the electric pump remains equal to 0 for the set duration, the duty cycle of the PWM signal is not 0%, and the duty cycle of the PWM signal falls in a duty cycle interval bounded by a first duty cycle and a second duty cycle.

16. The mode control system of claim 15, wherein
after entering the first sleep mode, the microcontroller is further configured to enter the working mode from the first sleep mode if the duty cycle of the PWM signal is not equal to 0%; and
after entering the second sleep mode, the microcontroller is further configured to obtain the PWM signal at every set interval of time, and enter the working mode from the second sleep mode if the duty cycle of the PWM signal falls outside the preset duty cycle interval.

17. An electronic device, comprising:
one or more processors; and
a non-transitory storage device, configured to store one or more programs,
wherein the one or more programs when executed by the one or more processors cause the one or more processors to perform the method as recited in claim 1.

* * * * *